US012740130B2

(12) United States Patent
Na et al.

(10) Patent No.: US 12,740,130 B2
(45) Date of Patent: Sep. 15, 2026

(54) INTEGRATED CIRCUIT DEVICE

(71) Applicant: SAMSUNG ELECTRONICS CO., LTD., Suwon-si (KR)

(72) Inventors: Chaeho Na, Suwon-si (KR); Sangkoo Kang, Suwon-si (KR); Donghyun Roh, Suwon-si (KR); Dahye Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 426 days.

(21) Appl. No.: 18/471,260

(22) Filed: Sep. 20, 2023

(65) Prior Publication Data

US 2024/0258399 A1 Aug. 1, 2024

(30) Foreign Application Priority Data

Jan. 31, 2023 (KR) ........................ 10-2023-0013190

(51) Int. Cl.

| | |
|---|---|
| ***H01L 29/49*** | (2006.01) |
| ***H01L 21/02*** | (2006.01) |
| ***H01L 29/06*** | (2006.01) |
| ***H01L 29/40*** | (2006.01) |
| ***H01L 29/417*** | (2006.01) |
| ***H01L 29/423*** | (2006.01) |

(Continued)

(52) U.S. Cl.

CPC ......... *H10D 64/671* (2025.01); *H10D 30/014* (2025.01); *H10D 30/43* (2025.01); *H10D 30/6729* (2025.01); *H10D 30/6735* (2025.01); *H10D 62/121* (2025.01); *H10D 64/01* (2025.01); *H10D 64/017* (2025.01); *H10D 64/021* (2025.01); *H10P 14/6922* (2026.01)

(58) Field of Classification Search

CPC ............. H10D 30/024; H10D 30/0241; H10D 30/501–509; H10D 30/62–6219; H10D 30/6735; H10D 84/0158; H10D 84/0193; H10D 84/834; H10D 84/8311–833; H10D 84/835–839; H10D 84/851–853; H10D 86/011; H10D 86/215; H10D 64/015; H10D 64/675

See application file for complete search history.

(56) References Cited

U.S. PATENT DOCUMENTS

| | | | |
|---|---|---|---|
| 9,236,452 | B2 | 1/2016 | Lim et al. |
| 9,728,643 | B2 | 8/2017 | Park et al. |

(Continued)

*Primary Examiner* — Victoria K. Hall

(74) *Attorney, Agent, or Firm* — Morgan, Lewis & Bockius LLP

(57) ABSTRACT

An integrated circuit device includes a gate line disposed on a fin-type active region, a source/drain region disposed on the fin-type active region, and an insulating spacer structure that covers the gate line and the source/drain region. The insulating spacer structure includes a first spacer portion that covers the sidewall of the gate line, a second spacer portion integrally connected to the first spacer portion, where the second spacer portion protrudes in a first lateral direction and covers a partial region of a sidewall of the source/drain region, and a spacer corner portion that fills a corner space defined by the gate line and the source/drain region between the first spacer portion and the second spacer portion. The insulating spacer structure has a single film structure that includes a SiOC film doped with about 0 at % to about 5 at % of nitrogen atoms.

18 Claims, 29 Drawing Sheets

(51) Int. Cl.

| | |
|---|---|
| ***H01L 29/66*** | (2006.01) |
| ***H01L 29/775*** | (2006.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 64/66*** | (2025.01) |
| ***H10P 14/692*** | (2026.01) |

(56) References Cited

U.S. PATENT DOCUMENTS

| | | | | |
|---|---|---|---|---|
| 10,790,361 | B2 | 9/2020 | Kim et al. | |
| 11,206,697 | B2 | 12/2021 | Tan et al. | |
| 11,329,141 | B2 | 5/2022 | Kao et al. | |
| 2017/0178962 | A1* | 6/2017 | Dube | H01L 21/02381 |
| 2020/0105620 | A1* | 4/2020 | Tan | H10D 84/0193 |
| 2020/0126868 | A1* | 4/2020 | Wang | H10D 64/015 |
| 2021/0066473 | A1* | 3/2021 | Lin | H10D 30/6219 |
| 2021/0296179 | A1 | 9/2021 | Ju et al. | |
| 2022/0102496 | A1 | 3/2022 | More | |
| 2022/0328475 | A1 | 10/2022 | Lin et al. | |

* cited by examiner

MEMORY

LOGIC

INTEGRATED CIRCUIT DEVICE

CROSS-REFERENCE TO RELATED APPLICATION

This application claims priority under 35 U.S.C. § 119 from Korean Patent Application No. 10-2023-0013190, filed on Jan. 31, 2023 in the Korean Intellectual Property Office, the contents of which are herein incorporated by reference in their entirety.

TECHNICAL FIELD

Embodiments of the inventive concept are directed to an integrated circuit (IC) device, and more particularly, to an IC device that includes a field-effect transistor (FET).

DISCUSSION OF THE RELATED ART

As IC devices become more downscaled, IC devices require not only a high operating speed but also high operating accuracy. In addition, as the integration density of IC devices increases and the size of the IC devices decreases, the possibility of that process defects occur increases during a process of manufacturing a nanosheet FET. Accordingly, an IC device that has a new structure that eliminates the possibility of process defects and increases the performance and reliability of the nanosheet FET is desired.

SUMMARY

Embodiments of the inventive concept provide an integrated circuit (IC) device in which a nanosheet field-effect transistor (FET) provides stable performance and increased reliability.

According to an embodiment of the inventive concept, there is provided an IC device that includes a fin-type active region that extends along a first lateral direction on a substrate, a pair of gate lines that extend along a second lateral direction on the fin-type active region, wherein the second lateral direction intersects the first lateral direction, a source/drain region disposed on the fin-type active region and interposed between the pair of gate lines, and a pair of insulating spacer structures that cover the pair of gate lines and the source/drain region. Each of the pair of insulating spacer structures includes a first spacer portion that covers a sidewall of one gate line of the pair of gate lines, where the first spacer portion extends along the second lateral direction, a second spacer portion integrally connected to the first spacer portion, where the second spacer portion protrudes in the first lateral direction and covers a partial region of a sidewall of the source/drain region, and a spacer corner portion that fills corner spaces defined by the one gate line and the source/drain region between the first spacer portion and the second spacer portion. Each of the pair of insulating spacer structures has a single film structure that includes a silicon oxycarbide (SiOC) film doped with about 0 at % to about 5 at % of nitrogen atoms.

According to another embodiment of the inventive concept, there is provided an IC device that includes a fin-type active region that extends along a first lateral direction on a substrate, at least one nanosheet that is spaced apart from a fin top surface of the fin-type active region in a vertical direction, where the at least one nanosheet faces the fin top surface of the fin-type active region, a gate line that surrounds the at least one nanosheet on the fin-type active region, where the gate line extends along a second lateral direction, wherein the second lateral direction intersects with the first lateral direction, a source/drain region disposed on the fin-type active region adjacent to the gate line, where the source/drain region is in contact with the at least one nanosheet, an insulating spacer structure that covers a sidewall of the gate line and a portion of the source/drain region, and a device isolation film that covers both sidewalls of the fin-type active region. The insulating spacer structure includes a first spacer portion that covers the sidewall of the gate line and extends along the second lateral direction, a second spacer portion integrally connected to the first spacer portion, where the second spacer portion protrudes in the first lateral direction and covers a partial region of a sidewall of the source/drain region, and a spacer corner portion that fills a corner space defined by the gate line and the source/drain region between the first spacer portion and the second spacer portion. The insulating spacer structure has a single film structure that includes a SiOC film doped with about 0 at % to about 5 at % of nitrogen atoms.

According to another embodiment of the inventive concept, there is provided an IC device that includes a fin-type active region, a source/drain region disposed on the fin-type active region, a pair of nanosheet stacks that are spaced apart from each other in a first lateral direction with the source/drain region interposed therebetween, where each nanosheet stack includes at least one nanosheet that is spaced apart in a vertical direction from a fin top surface of the fin-type active region, and each nanosheet stack faces the fin top surface of the fin-type active region and contacts the source/drain region, a pair of gate lines that surround the at least one nanosheet on the fin-type active region, where the pair of gate lines extends along a second lateral direction, where the second lateral direction intersects the first lateral direction, and a plurality of insulating spacer structures that cover the pair of gate lines and the source/drain region. The plurality of insulating spacer structures include a plurality of first spacer portions, a plurality of second spacer portions, and a plurality of spacer corner portions. The plurality of first spacer portions cover sidewalls of each of the pair of gate lines, the plurality of second spacer portions are integrally connected to the plurality of first spacer portions and cover a portion of the source/drain region, and the plurality of spacer corner portions are interposed between the plurality of first spacer portions and the plurality of second spacer portions, and fill corner spaces defined by the pair of gate lines and the source/drain region. A thickness of each of the plurality of spacer corner portions in the first lateral direction and a thickness of each of the plurality of spacer corner portions in the second lateral direction are each greater than a thickness of each of the plurality of first spacer portions in the first lateral direction, and each of the plurality of insulating spacer structures has a single film structure that includes a SiOC film doped with about 0 at % to about 5 at % of nitrogen atoms.

BRIEF DESCRIPTION OF THE DRAWINGS

FIGS. 3A and 3B are diagrams of an IC device according to embodiments, in which FIG. 3A is a cross-sectional view of some components in a portion of the IC device that corresponds to a cross-section taken along line Y1-Y1' of FIG. 1, and FIG. 3B is an enlarged plan view of some components of the IC device at a vertical level that correspond to a cross-section taken along line LV2-LV2 of FIG. 2A.

FIG. 4 is a block diagram of an IC device according to embodiments.

FIGS. 5 to 13C are cross-sectional views that illustrate a process sequence of a method of manufacturing an IC device, according to embodiments, in which FIGS. 5, 6A, 7A, 8A, 9, 10, 11A, 12A, and 13A are cross-sectional views taken along line X1-X1' of FIG. 1, FIGS. 6B, 7B, 8B, 12B, and 13B are cross-sectional views taken along line Y1-Y1' of FIG. 1, and FIGS. 6C, 8C, 11B, and 13C are cross-sectional views taken along line Y2-Y2' of FIG. 1.

DETAILED DESCRIPTION

Figure 1:
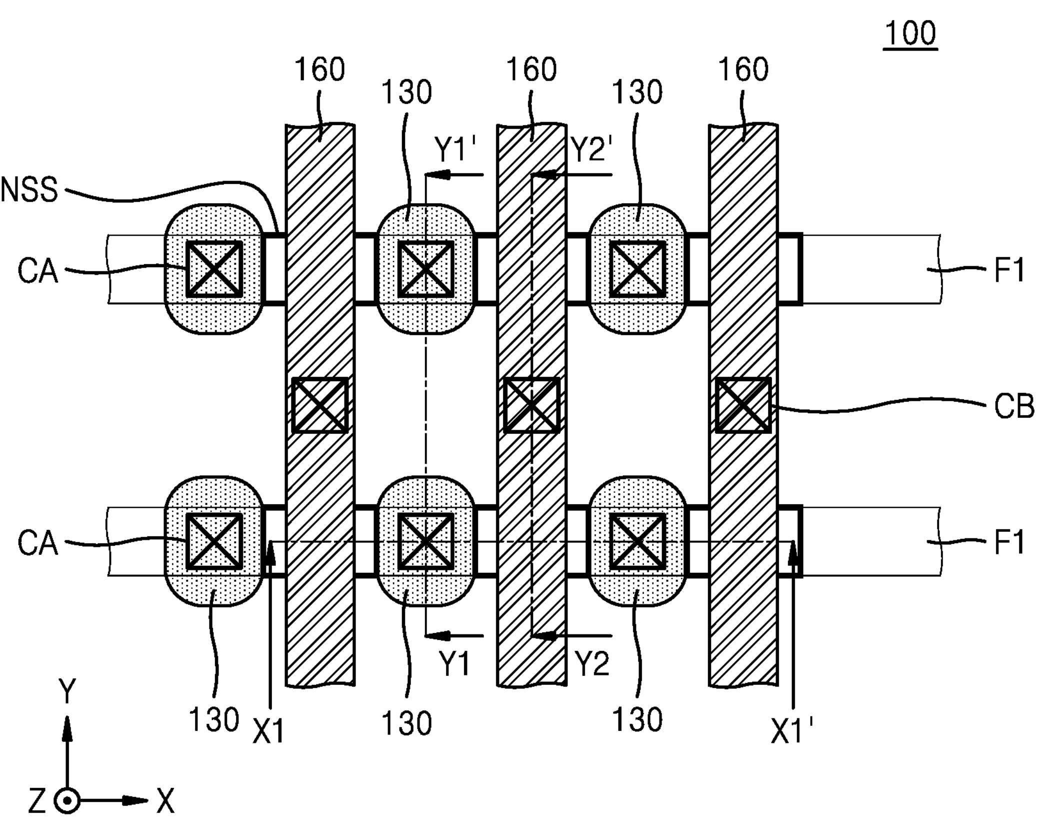
FIG. 1 is a plan layout diagram of an integrated circuit (IC) device according to embodiments.

Hereinafter, embodiments will be described in detail with reference to the accompanying drawings. The same reference numerals may be used to denote the same elements in the drawings, and repeated descriptions thereof may be omitted.

Figure 2A:
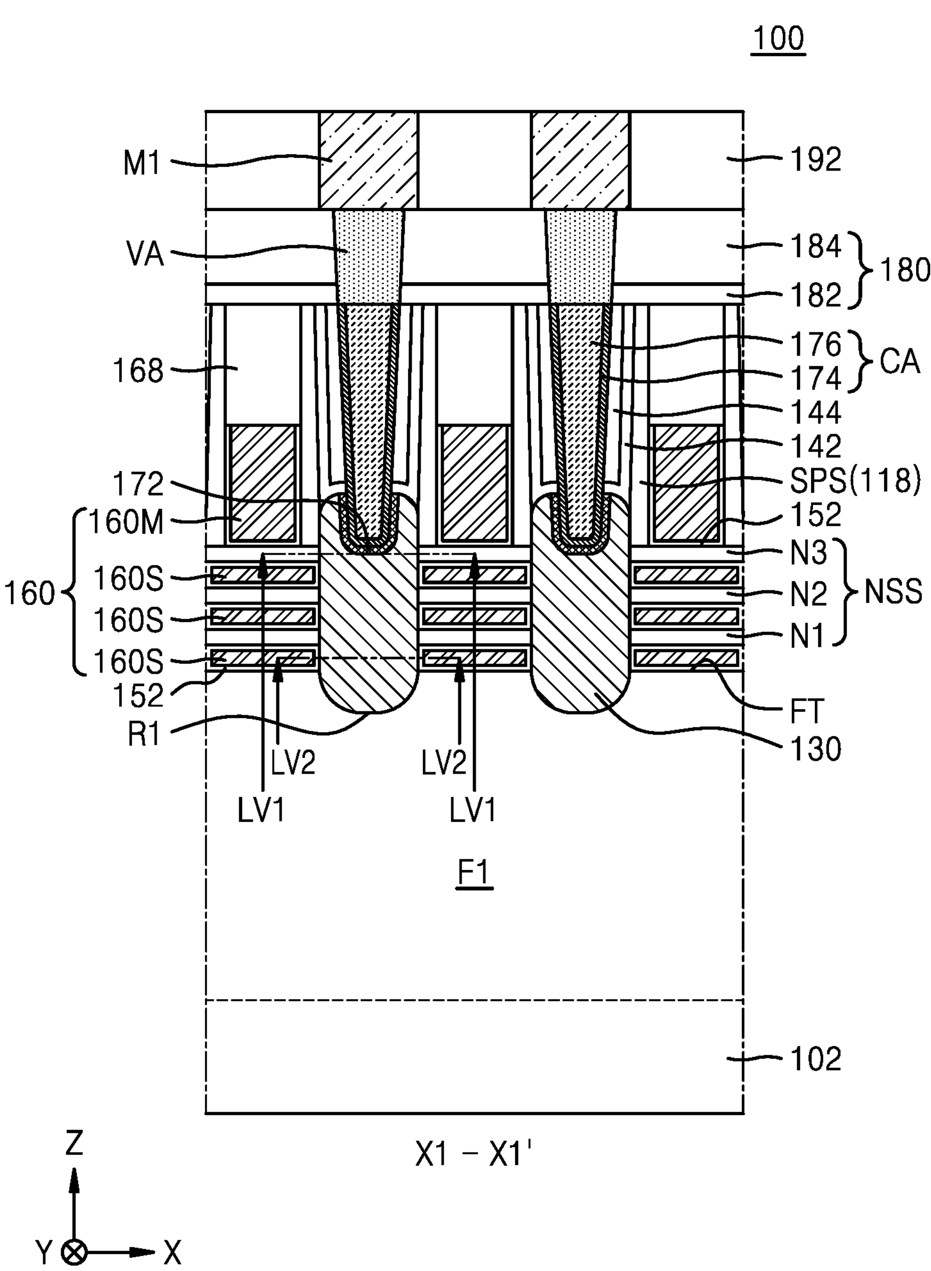
FIG. 2A is a cross-sectional view taken along line X1-X1' of FIG. 1.
Figure 2B:
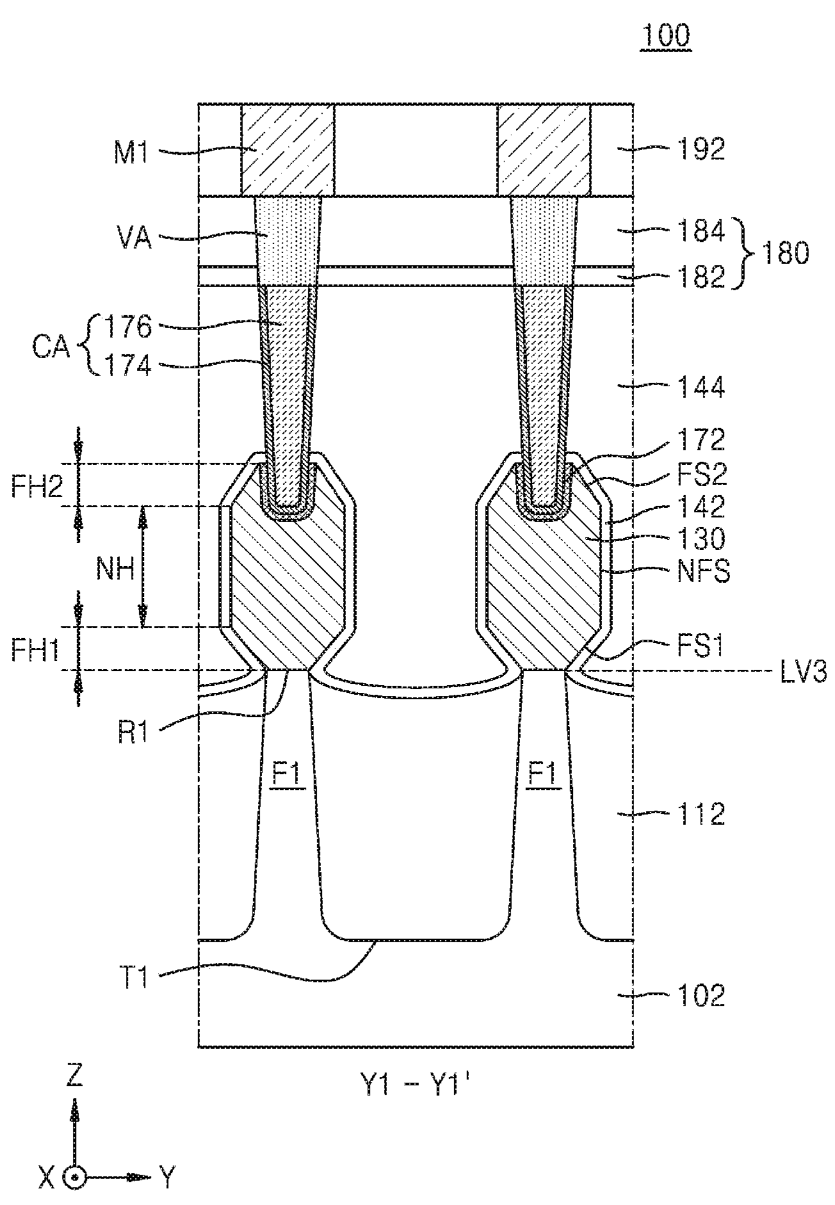
FIG. 2B is a cross-sectional view taken along line Y1-Y1' of FIG. 1.
Figure 2C:
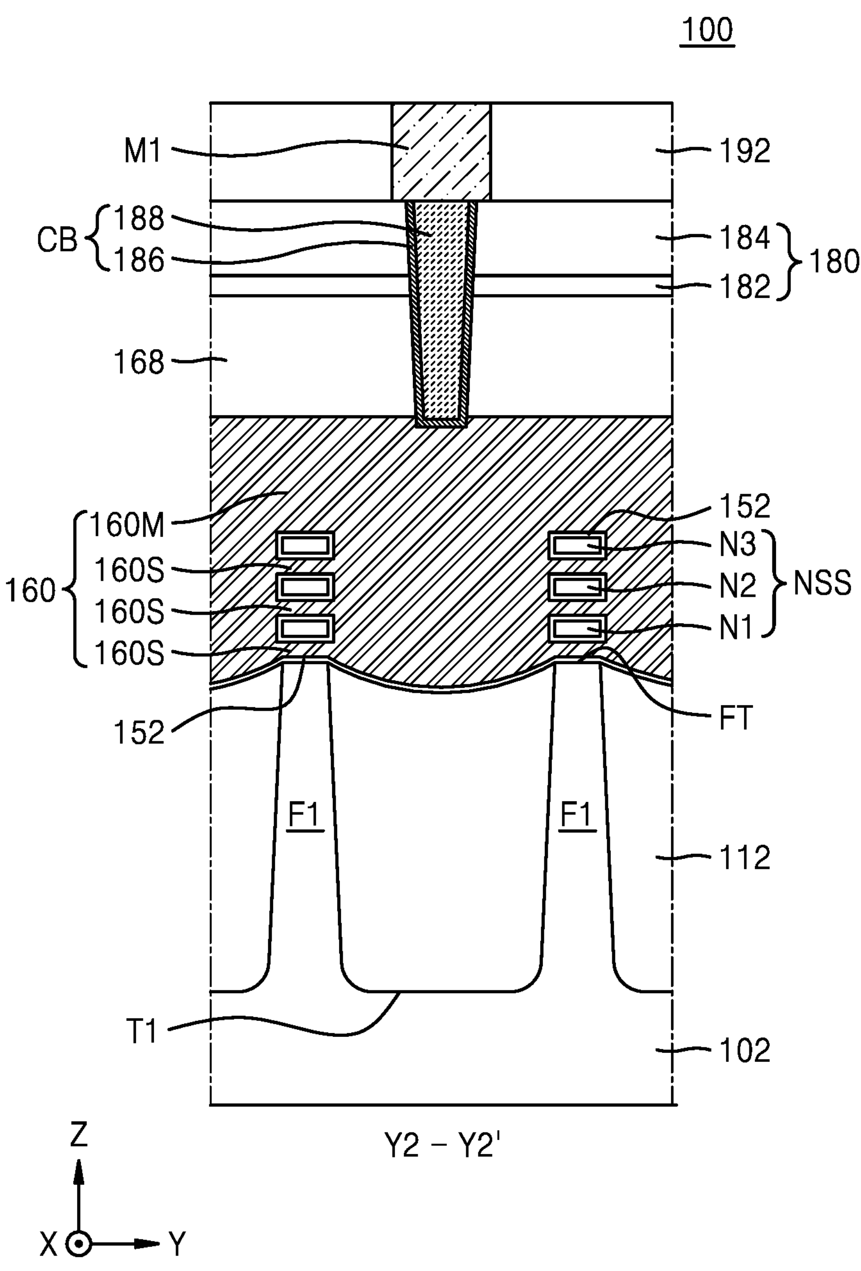
FIG. 2C is a cross-sectional view taken along line Y2-Y2' of FIG. 1.
Figure 2D:
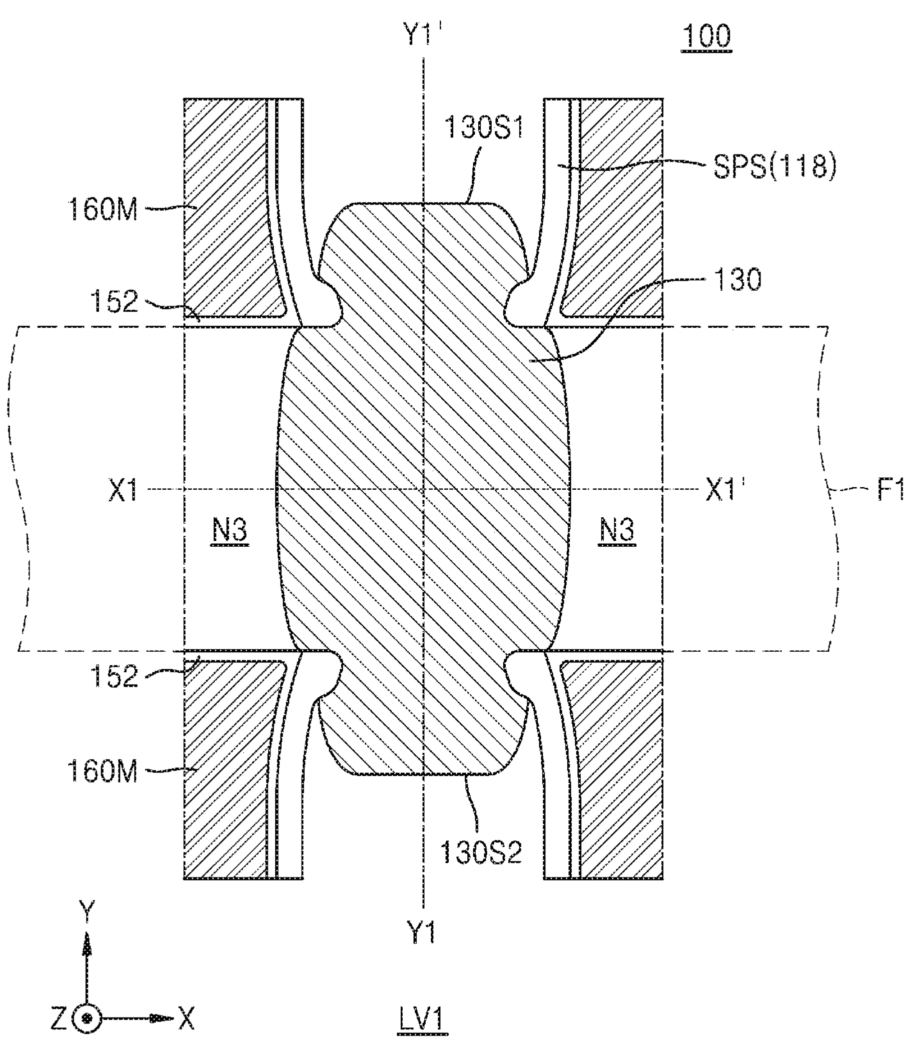
FIG. 2D is an enlarged plan view of some components at a vertical level that corresponds to a cross-section taken along line LV1-LV1 of FIG. 2A.
Figure 2E:
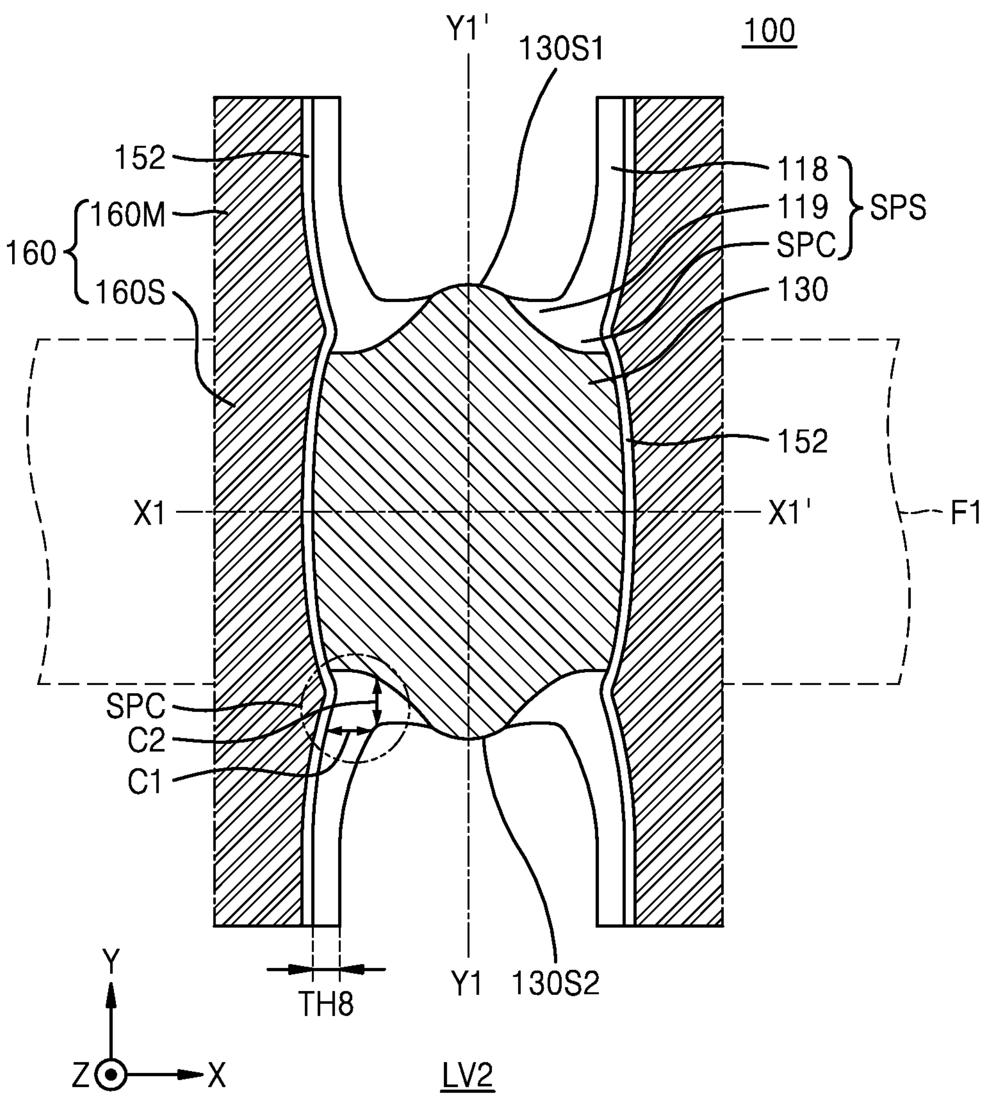
FIG. 2E is an enlarged plan view of some components at a vertical level that corresponds to a cross-section taken along line LV2-LV2 of FIG. 2A.

FIG. 1 is a plan layout diagram of an integrated circuit (IC) device 100 according to embodiments. FIG. 2A is a cross-sectional view taken along line X1-X1' of FIG. 1. FIG. 2B is a cross-sectional view taken along line Y1-Y1' of FIG. 1. FIG. 2C is a cross-sectional view taken along line Y2-Y2' of FIG. 1. FIG. 2D is an enlarged plan view of some components at a vertical level that corresponds to a cross-section taken along line LV1-LV1 of FIG. 2A. FIG. 2E is an enlarged plan view of some components at a vertical level that corresponds to a cross-section taken along line LV2-LV2 of FIG. 2A. The IC device 100 includes a field-effect transistor (FET) that has a gate-all-around structure that includes an active region of a nanowire or nanosheet type and a gate that surrounds the active region and is described with reference to FIGS. 1 and 2A to 2E.

Referring to FIGS. 1 and 2A to 2E, in an embodiment, the IC device 100 includes a plurality of fin-type active regions F1 and a plurality of nanosheet stacks NSS. The plurality of fin-type active regions F1 protrude upward from a substrate 102 in a vertical direction (Z direction) and extend along a first lateral direction (X direction) on the substrate 102. The plurality of nanosheet stacks NSS are disposed on the plurality of fin-type active regions F1. As used herein, the term "nanosheet" refers to a conductive structure having a cross-section that is substantially perpendicular to a direction in which current flows. The nanosheet may be interpreted as including a nanowire.

The substrate 102 includes a semiconductor element, such as silicon (Si) or germanium (Ge), or a compound semiconductor, such as one of silicon germanium (SiGe), silicon carbide (SiC), gallium arsenide (GaAs), indium arsenide (InAs), indium gallium arsenide (InGaAs), or indium phosphide (InP). As used herein, each of the terms "SiGe," "SiC," "GaAs," "InAs," "InGaAs," and "InP" refers to a material that includes the indicated elements therein, without referring to a chemical formula that represents a stoichiometric relationship.

A plurality of trench regions T1 that define the plurality of fin-type active regions F1 are formed in the substrate 102. A device isolation film 112 is disposed in the plurality trench regions T1. The device isolation film 112 cover respective sidewalls of the plurality of fin-type active regions F1 in the plurality of trench regions T1. The device isolation film 112 may include a silicon oxide film, without being limited thereto.

The device isolation film 112 is disposed on the substrate 102 and covers both sidewalls of each of the plurality of fin-type active regions F1. The device isolation film 112 includes one of an oxide film, a nitride film, or a combination thereof.

A plurality of gate lines 160 are disposed on and cross the plurality of fin-type active regions F1. Each of the plurality of gate lines 160 extends along a second lateral direction (Y direction) that intersects with the first lateral direction (X direction).

The plurality of nanosheet stacks NSS are respectively disposed on fin top surfaces FT of the plurality of fin-type active regions F1 at intersections between the plurality of fin-type active regions F1 and the plurality of gate lines 160. Each of the plurality of nanosheet stacks NSS includes at least one nanosheet that is spaced apart from the fin top surface FT of the fin-type active region F1 in the vertical direction (Z direction) and faces the fin top surface FT of the fin-type active region F1.

As shown in FIGS. 2A and 2C, each of the plurality of nanosheet stacks NSS includes a first nanosheet N1, a second nanosheet N2, and a third nanosheet N3 that overlap each other in the vertical direction (Z direction) on the fin-type active region F1. The first nanosheet N1, the second nanosheet N2, and the third nanosheet N3 are located at different vertical distances (Z-directional distances) from the fin top surface FT of the fin-type active region F1. Each of the first nanosheet N1, the second nanosheet N2, and the third nanosheet N3 is surrounded by the gate line 160.

Although FIG. 1 illustrates a case in which the nanosheet stack NSS has a substantially rectangular planar shape, embodiments of the inventive concept are not necessarily limited thereto. The nanosheet stack NSS may have various planar shapes based on a planar shape of each of the fin-type active region F1 and the gate line 160. An embodiment of FIG. 1 pertains to a configuration in which the plurality of nanosheet stacks NSS and the plurality of gate lines 160 are formed on one fin-type active region F1, and the plurality of nanosheet stacks NSS are arranged in a line in the first lateral direction (X direction) on one fin-type active region F1. However, the number of nanosheet stacks NSS and the number of gate lines 160 on one fin-type active region F1 are not specifically limited.

Each of the first to third nanosheets N1, N2, and N3 included in the nanosheet stack NSS includes a channel region. As used herein, each of the first to third nanosheets N1, N2, and N3 may be referred to as the channel region. In embodiments, each of the first nanosheet N1, the second nanosheet N2, and the third nanosheet N3 has a thickness in a range of about 4 nm to about 6 nm, without necessarily being limited thereto. For example, the thickness of each of the first to third nanosheets N1, N2, and N3 refers to a size of each of the first to third nanosheets N1, N2, and N3 in the vertical direction (Z direction). In embodiments, the first to third nanosheets N1, N2, and N3 have substantially the same thickness in the vertical direction (Z direction). In embodiments, at least some of the first to third nanosheets N1, N2, and N3 have different thicknesses in the vertical direction (Z direction).

In embodiments, at least some of the first to third nanosheets N1, N2, and N3 in one nanosheet stack NSS have different sizes in the first lateral direction (X direction). In embodiments, the first to third nanosheets N1, N2, and N3 have the same size in the first lateral direction (X direction).

As shown in FIGS. 2A, 2C, and 2E, each of the plurality of gate lines 160 includes a main gate portion 160M and a plurality of sub-gate portions 160S. The main gate portion 160M covers a top surface of the nanosheet stack NSS and extends in the second lateral direction (Y direction). The plurality of sub-gate portions 160S are integrally connected to the main gate portion 160M and are arranged between two adjacent nanosheets of the first to third nanosheets N1, N2, and N3 and between the first nanosheet N1 and the fin-type active region F1. In the vertical direction (Z direction), a thickness of each of the plurality of sub-gate portions 160S is less than a thickness of the main gate portion 160M.

Each of the plurality of gate lines 160 includes one of a metal, a metal nitride, a metal carbide, or a combination thereof. The metal is one of titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), or palladium (Pd). The metal nitride is one of titanium nitride (TiN) or tantalum nitride (TaN). The metal carbide may include titanium aluminum carbide (TiAlC). However, a material included in the plurality of gate lines 160 is not necessarily limited to the examples described above.

A gate dielectric film 152 is interposed between the nanosheet stack NSS and the gate line 160. In embodiments, the gate dielectric film 152 has a stack structure of an interface dielectric film and a high-k dielectric film. The interface dielectric film includes a low-k dielectric material film, such as one of a silicon oxide film, a silicon oxynitride film, or a combination thereof that has a dielectric constant of about 9 or less. In embodiments, the interface dielectric film is omitted. The high-k dielectric film includes a material that has a higher dielectric constant than a silicon oxide film. For example, the high-k dielectric film has a dielectric constant of about 10 to about 25. The high-k dielectric film may include hafnium oxide, without necessarily being limited thereto.

As illustrated in FIGS. 1, 2A, and 2B, a plurality of source/drain regions 130 are disposed on the fin-type active region F1. As shown in FIG. 2A, a pair of source/drain regions 130 are disposed on the fin-type active region F1 on both sides of one gate line 160 with the gate line 160 interposed therebetween. In addition, a pair of nanosheet stacks NSS are disposed on both sides of the one source/drain region 130 and are spaced apart from each other in the first lateral direction (X direction) with one source/drain region 130 interposed therebetween, and a pair of gate lines 160 surrounds the pair of nanosheet stacks NSS. The one source/drain region 130 is in contact with a sidewall of each of the pair of nanosheet stacks NSS.

A plurality of FETs are formed in portions where the plurality of fin-type active regions F1 intersect with the plurality of gate lines 160 on the substrate 102. The FETs may constitute a logic circuit or a memory device.

As illustrated in FIGS. 2A, 2D, and 2E, sidewalls of the plurality of gate lines 160 and sidewalls 130S1 and 130S2 of each of the plurality of source/drain regions 130 are partially covered by a plurality of insulating spacer structures SPS. Each of the plurality of insulating spacer structures SPS includes a first spacer portion 118, a second spacer portion 119, and a spacer corner portion SPC. The first spacer portion 118 covers the sidewall of the gate line 160 and extends along the second lateral direction (Y direction). The second spacer portion 119 covers a portion of the source/drain region 130. The spacer corner portion SPC fills a corner space defined by the gate line 160 and the source/drain region 130 between the first spacer portion 118 and the second spacer portion 119. In each of the plurality of insulating spacer structures SPS, each of the second spacer portion 119 and the spacer corner portion SPC are integrally connected to the first spacer portion 118.

To facilitate the understanding of relative positions of components of the IC device 100, each of FIGS. 2D and 2E illustrates a planar shape of the fin-type active region F1 with dashed lines, and are enlarged plan views at a vertical level that corresponds to a planar cross-section taken along line LV1-LV1 of FIG. 2A, and at a vertical level that corresponds to a planar cross-section taken along line LV2-LV2 of FIG. 2A, respectively.

In each of the plurality of insulating spacer structures SPS, the second spacer portion 119 protrudes from the first spacer portion 118 in the first lateral direction (X direction) and covers partial regions of the sidewalls 130S1 and 130S2 of the source/drain region 130. As shown in FIG. 2E, in each of the plurality of insulating spacer structures SPS, the second spacer portion 119 has a planar shape in which a width in the second lateral direction (Y direction) gradually decreases away from the gate line 160 adjacent thereto in the first lateral direction (X direction) toward an adjacent gate line 160.

Each of the plurality of spacer corner portions SPC fills the corner space between the gate line 160 and the source/drain region 130. As shown in FIG. 2E, in each of the plurality of insulating spacer structures SPS, a thickness C1 of the spacer corner portion SPC in the first lateral direction (X direction) and a thickness C2 of the spacer corner portion SPC in the second lateral direction (Y direction) is each greater than a thickness TH8 of each of a plurality of first spacer portions 118 in the first lateral direction (X direction).

Each of the plurality of insulating spacer structures SPS has a single film structure that includes a silicon oxycarbide (SiOC) film doped with about 0 atomic percent (at %) to about 5 at % of nitrogen atoms. In each of the plurality of insulating spacer structures SPS, the SiOC film includes about 2 at % to about 40 at % of carbon atoms, about 30 at % to about 60 at % of silicon atoms, and about 40 at % to about 70 at % of oxygen atoms. In an embodiment, in each of the plurality of insulating spacer structures SPS, the SiOC film may include 20 at % of carbon atoms, 35 at % of silicon atoms, and 45 at % of oxygen atoms. In an embodiment, in each of the plurality of insulating spacer structures SPS, the SiOC film may include 2 at % of carbon atoms, 40 at % of silicon atoms, and 58 at % of oxygen atoms. In an embodiment, in each of the plurality of insulating spacer structures SPS, the SiOC film may include 2 at % of carbon atoms, 35 at % of silicon atoms, and 63 at % of oxygen atoms. However, a composition of the SiOC film is not necessarily limited to the embodiments described above and can vary in other embodiments within the scope of the inventive concept.

In embodiments, each of the plurality of insulating spacer structures SPS includes a SiOC film that is not doped with nitrogen atoms. That is, the SiOC film does not include nitrogen atoms. In embodiments, each of the plurality of insulating spacer structures SPS includes a SiOC film doped with nitrogen atoms at a concentration of more than about 0 at % and about 5 at % or less.

As shown in FIG. 2B, each of the sidewalls 130S1 and 130S2 of each of the plurality of source/drain regions 130 in the second lateral direction (Y direction) may include at least one crystal facet and a facet-free sidewall portion NFS that extends in the vertical direction (Z direction). The at least one crystal facet includes a first crystal facet FS1 and a second crystal facet FS2. The first crystal facet FS1 is adjacent to the fin-type active region F1, and the second crystal facet FS2 is spaced apart in the vertical direction (Z direction) from the fin-type active region F1 with the facet-free sidewall portion NFS interposed therebetween. The first crystal facet FS1 includes a surface inclined in a direction toward the substrate 102, and the second crystal facet FS2 includes a surface inclined in a direction away from the substrate 102. In embodiments, the facet-free sidewall portion NFS includes a surface parallel to a direction in which the substrate 102 extends (or a direction parallel to an X-Y plane), without being limited thereto.

As shown in FIG. 2B, each of sidewalls of one source/drain region 130 in the second lateral direction (Y direction) includes the first crystal facet FS1, the facet-free sidewall portion NFS, and the second crystal facet FS2, which are sequentially arranged in the vertical direction (Z direction) away from the fin-type active region F1. In embodiments, in the vertical direction (Z direction), a height NH of the facet-free sidewall portion NFS is greater than each of a height FH1 of the first crystal facet FS1 and a height FH2 of the second crystal facet FS2. In embodiments, in the vertical direction (Z direction), the height NH of the facet-free sidewall portion NFS is greater than the sum of the height FH1 of the first crystal facet FS1 and the height FH2 of the second crystal facet FS2. In embodiments, in the vertical direction (Z direction), the height NH of the facet-free sidewall portion NFS is greater than ½ of the total height of the source/drain region 130.

In embodiments, the first crystal facet FS1 and the second crystal facet FS2 are formed at different growth rates on different surfaces during the formation of the plurality of source/drain regions 130. In embodiments, different from that shown in FIG. 2B, at least one of the plurality of source/drain regions 130 does not include at least one of the first crystal facet FS1 or the second crystal facet FS2.

A portion of the source/drain region 130 that includes the facet-free sidewall portion NFS has the greatest width in the second lateral direction (Y direction). The insulating spacer structure SPS covers only a partial region of the source/drain region 130, and does not cover at least a portion of the facet-free sidewall portion NFS of the source/drain region 130 in the vertical direction (Z direction). As used herein, the portion of the source/drain region 130 that includes the facet-free sidewall portion NFS may be referred to as a first portion. In embodiments, in at least one of the plurality of source/drain regions 130, portions of the first crystal facet FS1 and the second crystal facet FS2 that overlap the facet-free sidewall portion NFS in the vertical direction (Z direction) are not covered by the insulating spacer structure SPS.

In FIG. 2D, the portion of the source/drain region 130 that has the greatest width in the second lateral direction (Y direction) includes a portion that includes the facet-free sidewall portion NFS shown in FIG. 2B. The portion of the source/drain region 130 that has the greatest width in the second lateral direction (Y direction) is in approximately a central portion in the first lateral direction (X direction) of a region between a pair of gate lines 160 that are spaced apart from each other in the first lateral direction (X direction) with the source/drain region 130 interposed therebetween. The insulating spacer structure SPS is not disposed in the central portion between the pair of gate lines 160. As shown in FIG. 2E, the second spacer portion 119 in each of the plurality of insulating spacer structures SPS is not located in the central portion between the pair of gate lines 160 in which the portion of the source/drain region 130 that has the greatest width in the second lateral direction (Y direction) is located. Accordingly, in the central portion between the pair of gate lines 160, the source/drain region 130 include portions covered by a pair of the second spacer portions 119 that are adjacent to each other in the first lateral direction (X direction), and portions between the pair of adjacent second spacer portions 119 that are not covered by the pair of adjacent second spacer portions 119.

As shown in FIG. 2A, the first spacer portion 118 of each of the plurality of insulating spacer structures SPS covers both sidewalls of the main gate portion 160M on the top surfaces of the plurality of nanosheet stacks NSS. The first spacer portion 118 is spaced apart from the gate line 160 with a gate dielectric film 152 interposed therebetween.

In the plurality of gate lines 160, both sidewalls of each of a plurality of sub-gate portions 160S are spaced apart from the source/drain region 130 with the gate dielectric film 152 interposed therebetween. The gate dielectric film 152 is interposed between the sub-gate portion 160S of the gate line 160 and each of the first to third nanosheets N1, N2, and N3, and between the sub-gate portion 160S of the gate line 160 and the source/drain region 130. The gate dielectric film 152 includes a portion in contact with the source/drain region 130.

As shown in FIGS. 2A and 2B, a plurality of recesses R1 are formed in the fin-type active region F1. A lowermost surface of each of the plurality of recesses R1 is located at a lower vertical level than the fin top surface FT of the fin-type active region F1. As used herein, the term "vertical level" refers to a distance from the substrate 102 in the vertical direction (Z direction or −Z direction). In embodiments, as used herein, the term "vertical level" may refer to a distance from a top surface of the substrate 102, such as a bottom surface of the trench region T1 that separates the plurality of fin-type active regions F1 in the vertical direction (Z direction or −Z direction).

The plurality of source/drain regions 130 are disposed on the fin-type active region F1 inside the plurality of recesses R1. A bottom surface of each of the plurality of source/drain regions 130 is in contact with the recess R1. Each of the plurality of source/drain regions 130 is adjacent to at least one of the gate lines 160. Each of the plurality of source/drain regions 130 has sidewalls that face the first to third nanosheets N1, N2, and N3 in the adjacent nanosheet stack NSS. Each of the plurality of source/drain regions 130 is in contact with the first to third nanosheets N1, N2, and N3 in the adjacent nanosheet stack NSS.

Each of the plurality of source/drain regions 130 includes a $Si_{1-x}Ge_x$ layer (x>0) that is doped with a p-type dopant. A Ge content ratio of each of the plurality of source/drain regions 130 increases with increasing distance in the vertical direction (Z direction) from a bottom surface of the recess R1. The p-type dopant in the plurality of source/drain regions 130 includes boron (B) or gallium (Ga), without necessarily being limited thereto. As shown in FIG. 2B, a lowermost surface of each of the plurality of source/drain regions 130 is at the same or similar vertical level LV3 as that of an uppermost surface of the device isolation film 112.

As shown in FIGS. 2A and 2C, a top surface of each of the gate dielectric film 152, the gate line 160, and the first spacer portion 118 is covered by a capping insulating pattern 168. The capping insulating pattern 168 includes a silicon nitride film. Both sidewalls of each of the gate line 160 and the capping insulating pattern 168 are covered by the first spacer portion 118. The first spacer portion 118 covers both sidewalls of the main gate portion 160M on top surfaces of the plurality of nanosheet stacks NSS. The first spacer portion 118 is spaced apart from the gate line 160 with the gate dielectric film 152 interposed therebetween.

A metal silicide film 172 is formed on a top surface of each of the plurality of source/drain regions 130. The metal silicide film 172 includes at least one of titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), or palladium (Pd). For example, the metal silicide film 172 include titanium silicide, without necessarily being limited thereto.

As shown in FIGS. 2A and 2B, the plurality of first spacer portions 118, the plurality of source/drain regions 130, a plurality of metal silicide films 172, and the device isolation film 112 are covered by an insulating liner 142. The insulating liner 142 includes at least one of silicon nitride (SiN), silicon oxide (SiO), silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), or a combination thereof. In embodiments, the insulating liner 142 is omitted. An inter-gate dielectric film 144 is disposed on the insulating liner 142. The inter-gate dielectric film 144 includes one of a silicon nitride film, a silicon oxide film, SiON, SiOCN, or a combination thereof. When the insulating liner 142 is omitted, the inter-gate dielectric film 144 is in contact with the plurality of source/drain regions 130.

As shown in FIG. 2B, in each of the plurality of source/drain regions 130, the first crystal facet FS1 includes an inclined surface that is inclined toward the substrate 102 or toward the device isolation film 112 from the lowermost surface of the recess R1 in the fin-type active region F1. The insulating liner 142 is in contact with the fin-type active region F1, the source/drain region 130, and an interface between the fin-type active region F1 and the source/drain region 130 in a region adjacent to the lowermost surface of the recess R1.

As shown in FIGS. 1, 2A, and 2B, a plurality of source/drain contacts CA are disposed on the plurality of source/drain regions 130. Each of the plurality of source/drain contacts CA passes through the inter-gate dielectric film 144 and the insulating liner 142 in the vertical direction (Z direction) and contacts the metal silicide film 172. Each of the plurality of source/drain contacts CA is electrically connected to the source/drain region 130 through the metal silicide film 172. Each of the plurality of source/drain contacts CA is spaced apart in the first lateral direction (X direction) from the main gate portion 160M with the first spacer portion 118 interposed therebetween.

Each of the plurality of source/drain contacts CA includes a conductive barrier pattern 174 and a contact plug 176 that are sequentially stacked on the source/drain region 130. The conductive barrier pattern 174 surrounds and contacts a bottom surface and a sidewall of the contact plug 176. Each of the plurality of source/drain contacts CA passes through the inter-gate dielectric film 144 and the insulating liner 142 and extends along the vertical direction (Z direction). The conductive barrier pattern 174 is formed between the metal silicide film 172 and the contact plug 176. The conductive barrier pattern 174 has a surface in contact with the metal silicide film 172 and a surface in contact with the contact plug 176. In embodiments, the conductive barrier pattern 174 includes a metal or a conductive metal nitride. For example, the conductive barrier pattern 174 includes at least one of titanium (Ti), tantalum (Ta), tungsten (W), titanium nitride (TiN), tantalum (TaN), tungsten nitride (WN), tungsten carbon nitride (WCN), titanium silicon nitride (TiSiN), tantalum silicon nitride (TaSiN), tungsten silicon nitride (WSiN), or a combination thereof, without necessarily being limited thereto. The contact plug 176 includes at least one of molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, without necessarily being limited thereto.

As shown in FIGS. 2A, 2B, and 2C, a top surface of each of the plurality of source/drain contacts CA, the plurality of capping insulating patterns 168, and the inter-gate dielectric film 144 is covered by an upper insulating structure 180. The upper insulating structure 180 includes an etch stop film 182 and an interlayer insulating film 184 that are sequentially stacked on each of the plurality of source/drain contacts CA, the plurality of capping insulating patterns 168, and the inter-gate dielectric film 144. The etch stop film 182 includes at least one of silicon carbide (SiC), silicon nitride (SiN), nitrogen-doped silicon carbide (SiC:N), silicon oxycarbide (SiOC), aluminum nitride (AlN), aluminum oxynitride (AlON), aluminum oxide (AlO), aluminum oxycarbide (AlOC), or a combination thereof. The interlayer insulating film 184 includes at least one of an oxide film, a nitride film, an ultralow-k (ULK) film that has an ultralow dielectric constant K of about 2.2 to about 2.4, or a combination thereof. For example, the interlayer insulating film 184 includes at least one of a tetraethylorthosilicate (TEOS) film, a high-density plasma (HDP) film, a boro-phospho-silicate glass (BPSG) film, a flowable chemical vapor deposition (FCVD) oxide film, a silicon oxynitride (SiON) film, a silicon nitride (SiN) film, a silicon oxycarbide (SiOC) film, a SiCOH film, or a combination thereof, without necessarily being limited thereto.

As shown in FIGS. 2A and 2B, a plurality of source/drain via contacts VA are on the plurality of source/drain contacts CA. Each of the plurality of source/drain via contacts VA passes through the upper insulating structure 180 and is in contact with the source/drain contact CA. Each of the plurality of source/drain regions 130 is electrically connected to the source/drain via contact VA through the metal silicide film 172 and the source/drain contact CA. A bottom surface of each of the plurality of source/drain via contacts VA is in contact with the top surface of the source/drain contact CA. The plurality of source/drain via contacts VA each include a contact plug that includes one of molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof. Each of the plurality of source/drain via contacts VA further includes a conductive barrier pattern that surrounds the contact plug. The conductive barrier pattern includes a metal or a metal nitride. For example, the conductive barrier pattern includes one of Ti, Ta, W, TiN, TaN, WN, WCN, TiSiN, TaSiN, WSiN, or a combination thereof, without necessarily being limited thereto.

As shown in FIGS. 1 and 2C, a gate contact CB is disposed on the gate line 160. The gate contact CB is connected to the gate line 160 by passing through the upper insulating structure 180 and the capping insulating pattern

168 in the vertical direction (Z direction). A bottom surface of the gate contact CB is in contact with a top surface of the gate line 160. In embodiments, the gate contact CB includes a conductive barrier pattern 186 and a contact plug 188. Details of the conductive barrier pattern 186 and the contact plug 188 are substantially the same as those of the conductive barrier pattern 174 and the contact plug 176, respectively.

As shown in FIGS. 2A, 2B, and 2C, the top surface of each of the upper insulating structure 180, the plurality of source/drain via contacts VA, and the gate contact CB are covered by an upper insulating film 192. A constituent material of the upper insulating film 192 is substantially the same as that of the interlayer insulating film 184. A plurality of upper wiring layers M1 pass through the upper insulating film 192. Each of the plurality of upper wiring layers M1 is connected to a corresponding source/drain via contact VA located thereunder or a corresponding gate contacts CB. The plurality of upper wiring layers M1 include one of molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, without necessarily being limited thereto.

As described above with reference to FIGS. 1 and 2A to 2E, the IC device 100 includes an insulating spacer structure SPS that covers the gate line 160 and the source/drain region 130 adjacent thereto, and the insulating spacer structure SPS includes a first spacer portion 118, a second spacer portion 119, and a spacer corner portion SPC. The first spacer portion 118 covers the sidewall of the gate line 160 and extends along the second lateral direction (Y direction). The second spacer portion 119 is integrally connected to the first spacer portion 118 and protrudes in the first lateral direction (X direction) to cover partial regions of the sidewalls 130S1 and 130S2 of the source/drain region 130. The spacer corner portion SPC fills a corner space defined by the gate line 160 and the source/drain region 130. The insulating spacer structure SPS either does not include nitrogen atoms or includes about 0 at % to about 5 at % of trace nitrogen atoms. Accordingly, when an epitaxial growth process that forms the source/drain region 130 is being performed during a process of manufacturing the IC device 100, substantially no epitaxial growth occurs on the surface of the insulating spacer structure SPS. Thus, the insulating spacer structure SPS covers the sidewalls 130S1 and 130S2 of the source/drain region 130 only in the corner space adjacent to the gate line 160 and a region adjacent to the corner space. In addition, even when the sidewalls 130S1 and 130S2 of the source/drain region 130 include portions that are not covered by the insulating spacer structure SPS, excessive lateral growth of the source/drain region 130 in the second lateral direction (Y direction) can be suppressed. Accordingly, a width of the source/drain region 130 in the second lateral direction (Y direction) is appropriately controlled. In addition, a plurality of source/drain regions 130, in particular, a plurality of source/drain regions 130 that have different conductivity types, that are adjacent to each other in the second lateral direction (Y direction) are prevented from coming into contact with each other.

In addition, of the insulating spacer structure SPS, the spacer corner portion SPC that fills the corner space defined by the gate line 160 and the source/drain region 130 has a thickness that is greater than thicknesses of other portions of the insulating spacer structure SPS. Therefore, even when an edge portion of the source/drain region 130 that is adjacent to the gate line 160 has a structure that is relatively vulnerable to physical and/or chemical attacks, the edge portion of the source/drain region 130 is protected by the spacer corner portion SPC, and thus, the attacks can be prevented from affecting the source/drain region 130. Accordingly, during a process of manufacturing the IC device 100, failures, such as a deterioration of the source/drain region 130 due to attacks and a short circuit that occurs between the source/drain region 130 and a conductive region adjacent thereto, can be prevented and the reliability of the IC device 100 can be increased.

Figure 3A:
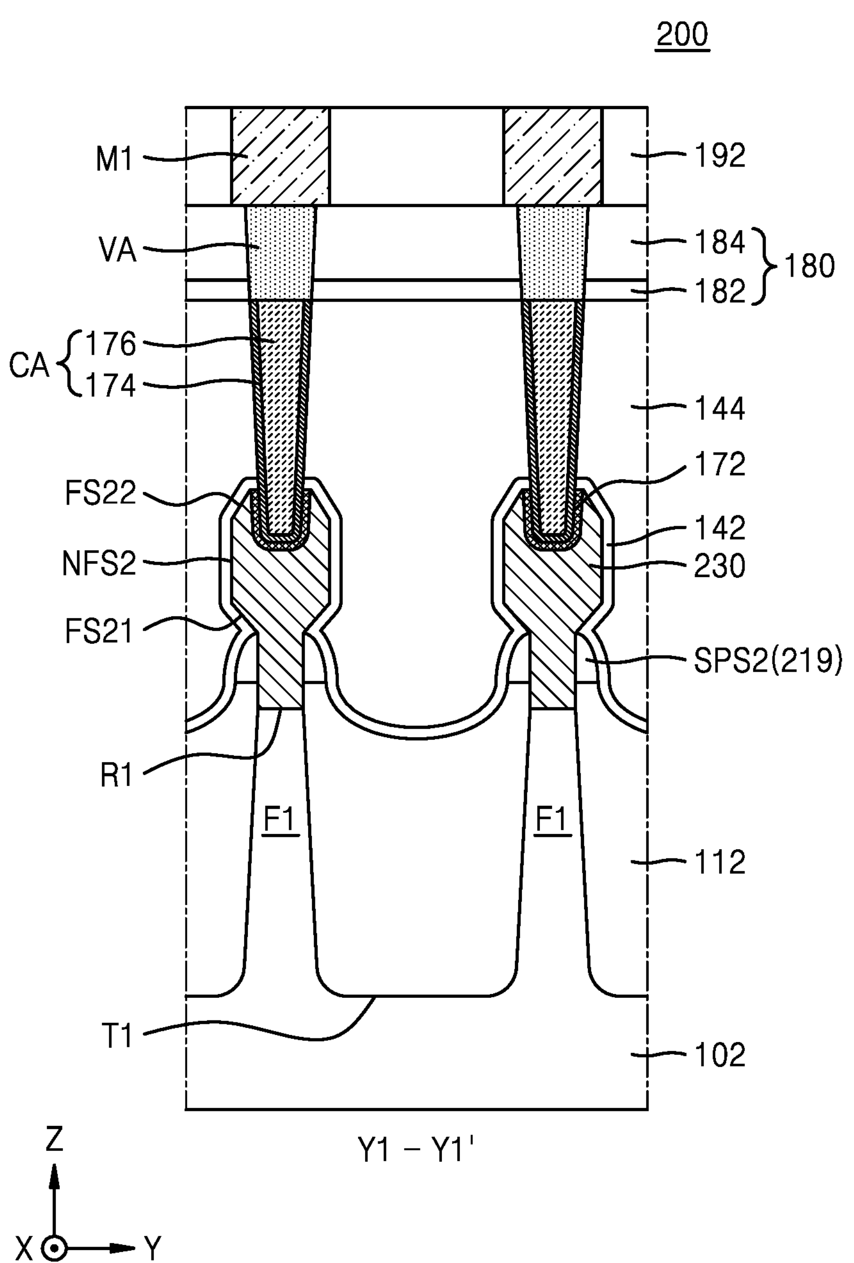
Figure 3B:
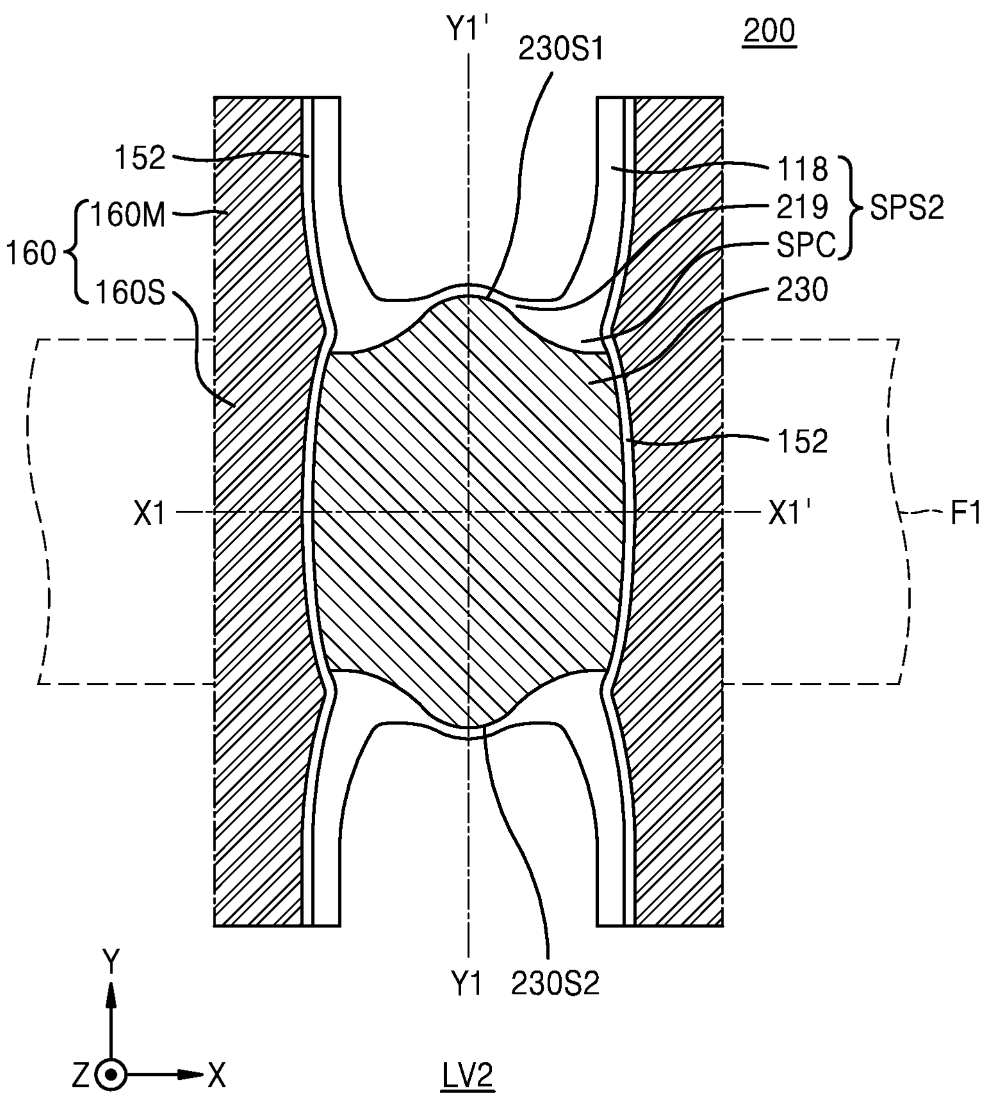

FIGS. 3A and 3B illustrate an IC device according to embodiments. FIG. 3A is a cross-sectional view of some components in a portion of an IC device 200 that corresponds to a cross-section taken along line Y1-Y1' of FIG. 1. FIG. 3B is an enlarged plan view of some components of the IC device 200 at a vertical level that corresponds to a planar cross-section taken along line LV2-LV2 of FIG. 2A. In FIGS. 3A and 3B, the same reference numerals are used to denote the same elements as in FIGS. 1 and 2A to 2E, and repeated descriptions thereof will be omitted.

Referring to FIGS. 3A and 3B, in an embodiment, the IC device 200 has substantially the same configuration as the IC device 100 described with reference to FIGS. 1 and 2A to 2E. However, the IC device 200 includes a pair of insulating spacer structures SPS2 that are interposed between a pair of adjacent gate lines 160 in a first lateral direction (X direction) with one source/drain region 230 interposed therebetween. Details of the source/drain region 230 and the insulating spacer structure SPS2 of the IC device 200 are substantially the same as those of the source/drain region 130 and the insulating spacer structure SPS that have been described with reference to FIGS. 2A to 2E.

Each of the pair of insulating spacer structures SPS2 includes a first spacer portion 118, a second spacer portion 219, and a spacer corner portion SPC. The first spacer portion 118 covers a sidewall of the gate line 160 and extends along a second lateral direction (Y direction). The second spacer portion 219 covers a portion of the source/drain region 230. The spacer corner portion SPC fills a corner space defined by the gate line 160 and the source/drain region 230 between the first spacer portion 118 and the second spacer portion 219. However, the second spacer portions 219 respectively included in the pair of insulating spacer structures SPS2 are integrally connected to each other. Accordingly, a portion of the source/drain region 230 that has the greatest width in the second lateral direction (Y direction) is in approximately a central portion in the first lateral direction (X direction) of a region between a pair of gate lines 160 that are apart from each other in the first lateral direction (X direction) with the source/drain region 230 interposed therebetween. In addition, the second spacer portions 219 respectively included in the pair of insulating spacer structures SPS2 continuously extend between the pair of gate lines 160. Thus, the portion of the source/drain region 230 that has the greatest width in the second lateral direction (Y direction) overlaps the second spacer portion 219 in a vertical direction (Z direction).

Each of the sidewalls 230S1 and S230S2 of one source/drain region 230 in the second lateral direction (Y direction) include a first crystal facet FS21, a facet-free sidewall portion NFS2, and a second crystal facet FS22 that are sequentially arranged in a direction in the vertical direction (Z direction) away from the fin-type active region F1. In embodiments, in the vertical direction (Z direction), a height of the facet-free sidewall portion NFS2 is greater than each of a height of the first crystal facet FS21 and a height of the second crystal facet FS22. In embodiments, in the vertical direction (Z direction), the height of the facet-free sidewall portion NFS2 is greater than the sum of the height of the first crystal facet FS21 and the height of the second crystal facet FS22. In embodiments, in the vertical direction (Z direction), the height of the facet-free sidewall portion NFS2 is greater than ½ of the total height of the source/drain region 230.

In embodiments, the first crystal facet FS21 and the second crystal facet FS22 are formed at different growth rates on different surfaces during the formation of a plurality of source/drain regions 230. In embodiments, different from that shown in FIG. 3A, at least one of the plurality of source/drain regions 230 does not include at least one of the first crystal facet FS21 or the second crystal facet FS22.

A portion of the source/drain region 230 that includes the facet-free sidewall portion NFS2 has a greatest width in the second lateral direction (Y direction). The second spacer portion 219 of the insulating spacer structure SPS2 includes a portion that overlaps at least a portion of the facet-free sidewall portion NFS2 of the source/drain region 230 in the vertical direction (Z direction). As used herein, the portion of the source/drain region 230 that includes the facet-free sidewall portion NFS2 may be referred to as a first portion.

In FIG. 3B, a portion of the source/drain region 230 that has a greatest width in the second lateral direction (Y direction) includes the facet-free sidewall portion NFS2 shown in FIG. 3A. The portion of the source/drain region 230 that has the greatest width in the second lateral direction (Y direction) is in approximately a central portion in the first lateral direction (X direction) of a region between a pair of gate lines 160 that are spaced apart from each other in the first lateral direction (X direction) with the source/drain region 230 interposed therebetween. As shown in FIG. 3B, the second spacer portion 219 in each of the plurality of insulating spacer structures SPS2 extends to the central portion between the pair of gate lines 160 in which the portion of the source/drain region 230 that has the greatest width in the second lateral direction (Y direction) is located. As shown in FIG. 3B, the second spacer portion 219 in each of the pair of insulating spacer structures SPS2 has a smallest width in the second lateral direction (Y direction) in the central portion of the region between the pair of gate lines 160.

In the IC device 200 shown in FIGS. 3A and 3B, similar to the IC device 100 described with reference to FIGS. 1 and 2A to 2E, the insulating spacer structure SPS2 either does not include nitrogen atoms or includes about 0 at % to about 5 at % of trace nitrogen atoms. Accordingly, when an epitaxial growth process that forms the source/drain region 230 is being performed during a process of manufacturing the IC device 200, substantially no epitaxial growth occurs on the surface of the insulating spacer structure SPS2. Therefore, excessive lateral growth of the source/drain region 230 in the second lateral direction (Y direction) is inhibited. In addition, a plurality of source/drain regions 230, such as a plurality of source/drain regions 230 that have different conductivity types, that are adjacent to each other in the second lateral direction (Y direction) are prevented from coming into contact with each other.

In addition, of the insulating spacer structure SPS2, the spacer corner portion SPC that fills the corner space defined by the gate line 160 and the source/drain region 230 has a thickness that is greater than thicknesses of other portions of the insulating spacer structure SPS2. Accordingly, during a process of manufacturing the IC device 200, failures, such as the deterioration of the source/drain region 230 due to surrounding attacks and a short circuit that occurs between the source/drain region 230 and an adjacent conductive region can be prevented and the reliability of the IC device 200 can be increased.

Figure 4:
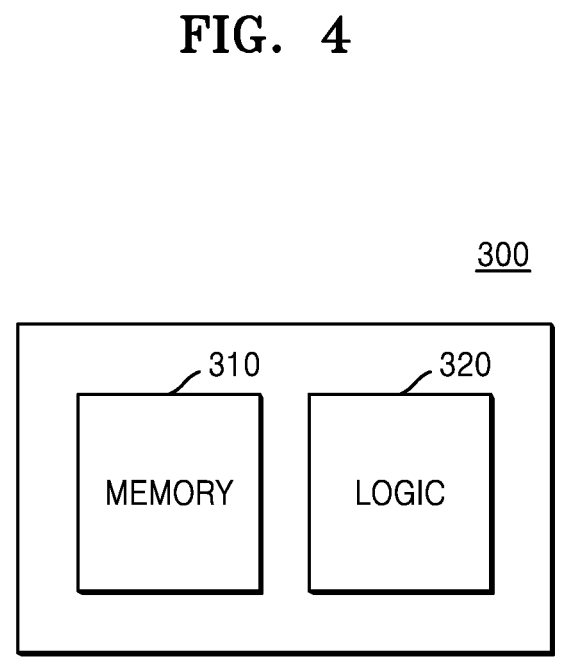

FIG. 4 is a block diagram of an IC device 300 according to embodiments.

Referring to FIG. 4, the IC device 300 includes a memory region 310 and a logic region 320. At least one of the memory region 310 or the logic region 320 includes at least one of the components of the IC devices 100 and 200 that have been described with reference to FIGS. 1 to 3B.

The memory region 310 includes at least one of a static random access memory (SRAM), a dynamic RAM (DRAM), a magnetic RAM (MRAM), a resistive RAM (RRAM), or a phase-change RAM (PRAM). For example, the memory region 310 includes an SRAM. The logic region 320 includes standard cells that perform desired logical functions, such as counters and buffers. The standard cell includes various kinds of logic cells that include a plurality of circuit elements, such as transistors and registers. For example, the logic cell includes one or more of an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D-flip-flop, a reset flip-flop, a master-servant flip-flop, or a latch.

FIGS. 5 to 13C are cross-sectional views that illustrate a process sequence of a method of manufacturing an IC device, according to embodiments. More specifically, FIGS. 5, 6A, 7A, 8A, 9, 10, 11A, 12A, and 13A are cross-sectional views taken along line X1-X1' of FIG. 1, according to a process sequence. FIGS. 6B, 7B, 8B, 12B, and 13B are cross-sectional views taken along line Y1-Y1' of FIG. 1, according to a process sequence. FIGS. 6C, 8C, 11B, and 13C are cross-sectional views taken along line Y2-Y2' of FIG. 1, according to a process sequence. An embodiment of a method of manufacturing the IC device 100 shown in FIGS. 1 and 2A to 2E is described with reference to FIGS. 5 to 13C. In FIGS. 5 to 13C, the same reference numerals are used to denote the same elements as in FIGS. 1 and 2A to 2E, and repeated descriptions thereof will be omitted.

Figure 5:
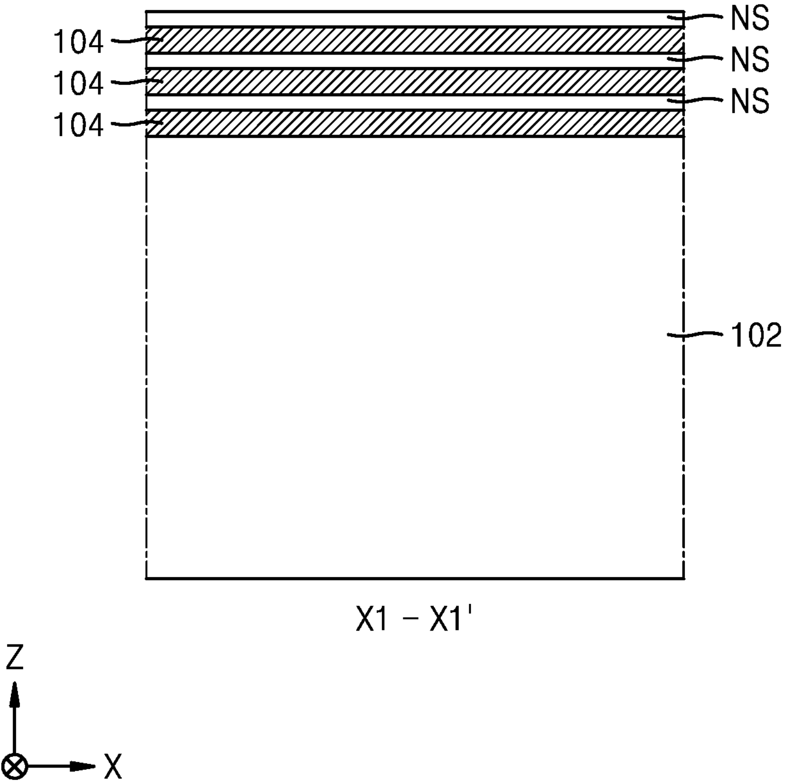

Referring to FIG. 5, in an embodiment, a plurality of sacrificial semiconductor layers 104 and a plurality of nanosheet semiconductor layers NS are alternately stacked one-by-one on a substrate 102.

The plurality of sacrificial semiconductor layers 104 and the plurality of nanosheet semiconductor layers NS include semiconductor materials that have different etch selectivities from each other. In embodiments, the plurality of nanosheet semiconductor layers NS include an Si layer and the plurality of sacrificial semiconductor layers 104 include an SiGe layer. In embodiments, the plurality of sacrificial semiconductor layers 104 have a constant Ge content. The SiGe layer in the plurality of sacrificial semiconductor layers 104 has a constant Ge content that is in a range of about 5 at % to about 60 at %, for example, about 10 at % to about 40 at %. The Ge concentration of the SiGe layer in the plurality of sacrificial semiconductor layers 104 can be changed as needed.

Figure 6A:
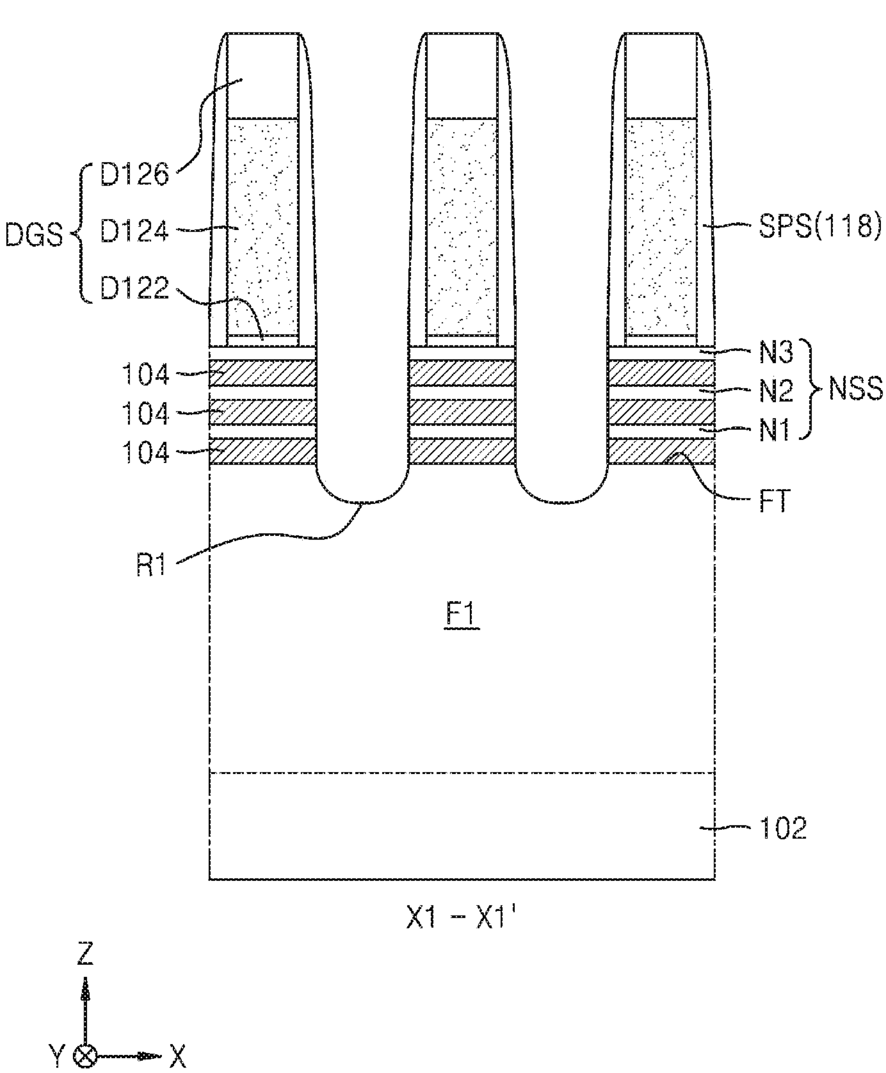
Figure 6B:
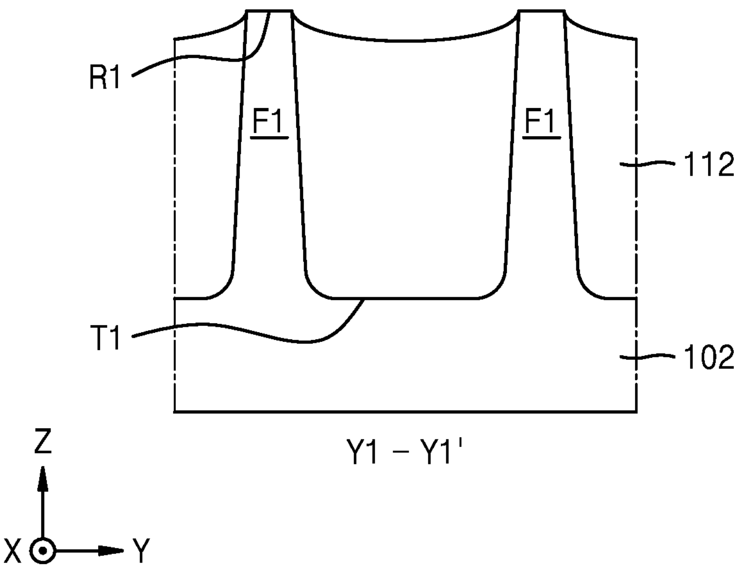
Figure 6C:
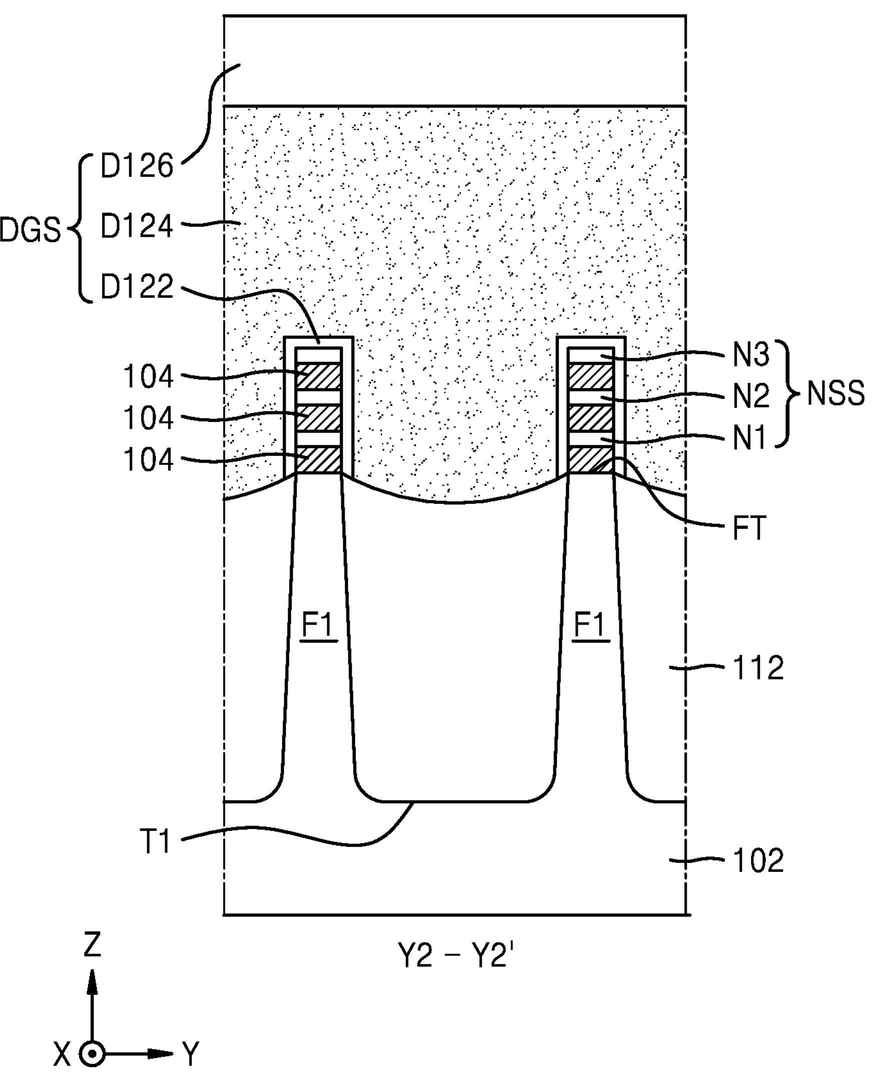

Referring to FIGS. 6A, 6B, and 6C, in an embodiment, a mask pattern is formed on the resultant structure of FIG. 5. Thereafter, the plurality of sacrificial semiconductor layers 104, the plurality of nanosheet semiconductor layers NS, and the substrate 102 are partially etched by using the mask pattern as an etch mask, and thus, a plurality of fin-type active regions F1 are formed on the substrate 102. A plurality of trench regions T1 are formed between the plurality of fin-type active regions F1 on the substrate 102. In embodiments, a stack structure of the plurality of sacrificial semiconductor layers 104 and the plurality of nanosheet semiconductor layers NS remains on a fin top surface FT of each of the plurality of fin-type active regions F1.

Thereafter, a device isolation film 112 is formed that covers a sidewall of each of the plurality of fin-type active regions F1, and a plurality of dummy gate structures DGS are formed on the stack structure of the plurality of sacrificial semiconductor layers 104 and the plurality of nanosheet semiconductor layers NS. Each of the plurality of dummy gate structures DGS extends along a second lateral direction (Y direction). Each of the plurality of dummy gate structures DGS has a structure in which an oxide film D122, a dummy gate layer D124, and a capping layer D126 are sequentially stacked. In embodiments, the dummy gate layer D124 includes polysilicon and the capping layer D126 includes a silicon nitride film.

A spacer insulating film is formed that covers both sidewalls of each of the plurality of dummy gate structures DGS. While a plurality of insulating spacer structures SPS are being formed by anisotropically dry etching the spacer insulating film, a portion of each of the plurality of sacrificial semiconductor layers 104 and the plurality of nanosheet semiconductor layers NS and a portion of the fin-type active region F1 is etched by using the plurality of dummy gate structures DGS and the spacer insulating film as etch masks. Thus, the plurality of nanosheet semiconductor layers NS are divided into a plurality of nanosheet stacks NSS and a plurality of recesses R1 are formed on an upper portion of the fin-type active region F1. To form the plurality of recesses R1, an etching process is performed on the fin-type active region F1 by using one of a dry etching process, a wet etching process, or a combination thereof. As a result, an insulating spacer structure SPS is obtained from the spacer insulating film. Each of the plurality of nanosheet stacks NSS includes a first nanosheet N1, a second nanosheet N2, and a third nanosheet N3.

The spacer insulating film has a single film structure that includes an SiOC film doped with about 0 at % to about 5 at % of nitrogen atoms. A constituent material of the spacer insulating film is the same as that of the insulating spacer structure SPS, which has been described above with reference to FIGS. 2A to 2E. Because the spacer insulating film includes the SiOC film doped with about 0 at % to about 5 at % of nitrogen atoms, there is no need to separately add a protective film, such as a silicon oxide film; before the spacer insulating film is formed. Thus, the number of processes that form the insulating spacer structure SPS can be reduced. In addition, because the spacer insulating film has a single film structure, a process of manufacturing the IC device 100 is simplified as compared to a case in which the spacer insulating film has a multilayered structure.

In addition, when the capping layer D126 in each of the plurality of dummy gate structures DGS includes a silicon nitride film, a relatively large difference in etch selectivity between the spacer insulating film and the capping layer D126 is ensured. Thus, when the spacer insulating film is being etched to form the plurality of recesses R1, the consumption of the capping layer D126 due to an etching atmosphere of the spacer insulating film is minimized. Accordingly, during the formation of the plurality of recesses R1, undesired deformation of the capping layer D126, such as the etching of side surfaces of the capping layer D126, can be suppressed and the capping layer D126 can maintain a sufficient height to be used as an etch mask.

Therefore, the dimension of each of the plurality of nanosheet stacks NSS and the plurality of recesses R1 can be precisely controlled according to specifications.

Figure 7A:
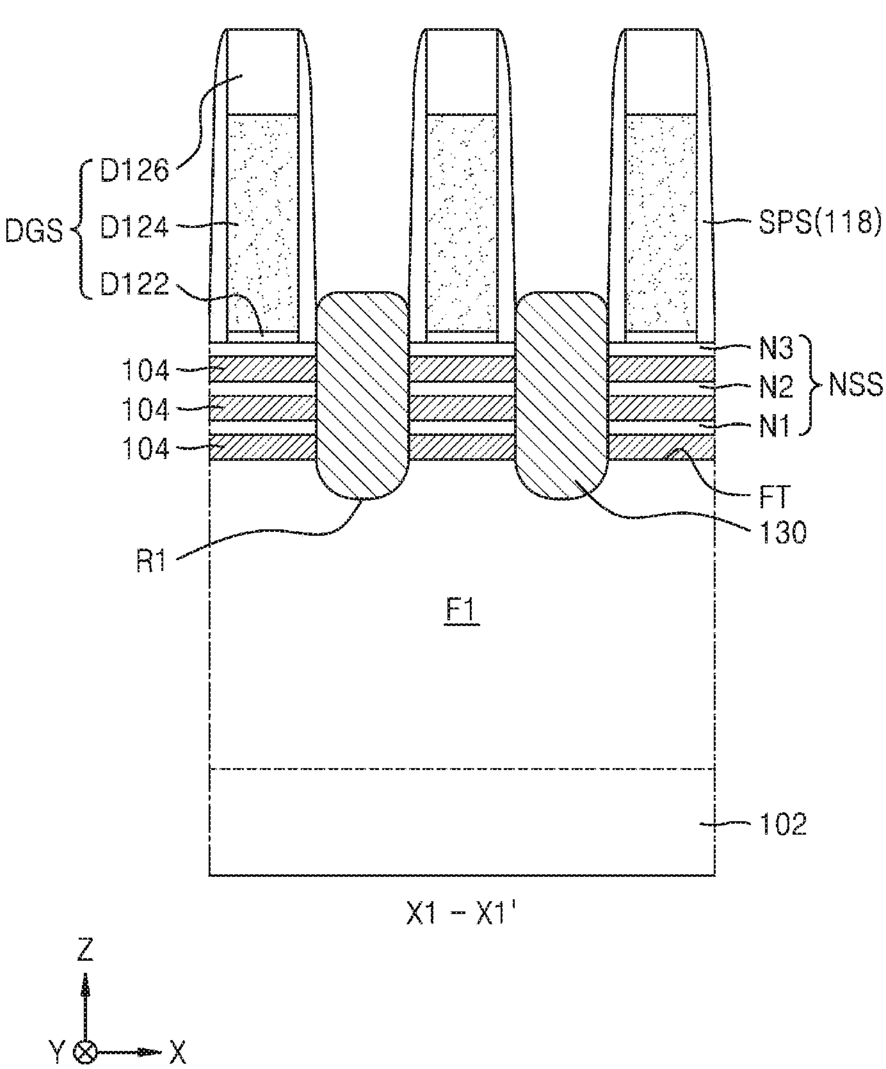
Figure 7B:
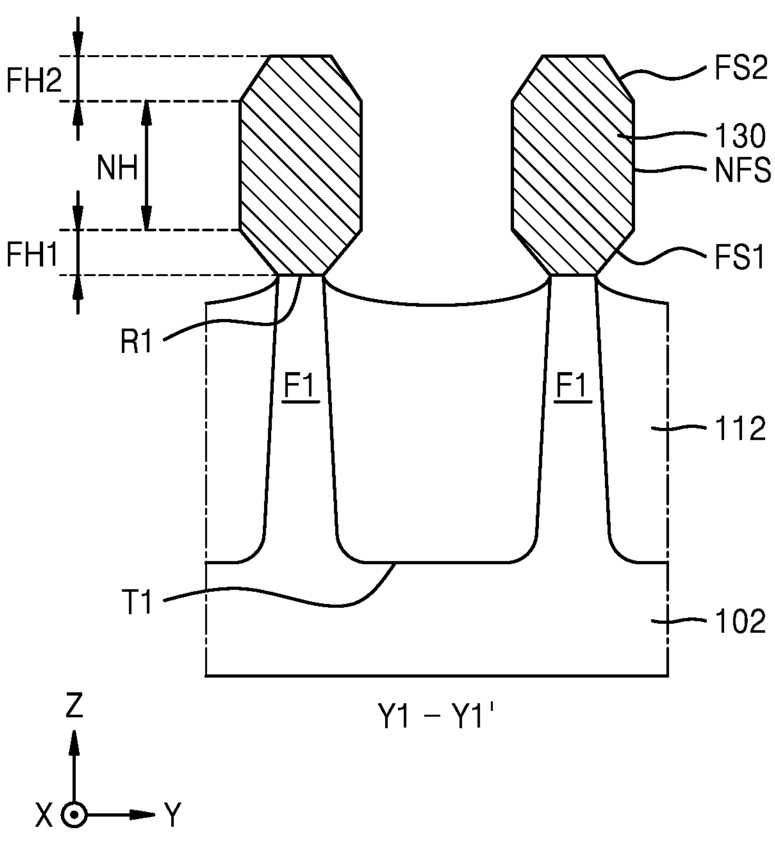

Referring to FIGS. 7A and 7B, in an embodiment, in the resultant structure of FIGS. 6A, 6B, and 6C, a plurality of source/drain regions 130 are formed that fill the plurality of recesses R1.

To form the plurality of source/drain regions 130, a semiconductor material is epitaxially grown from a surface of the fin-type active region F1 exposed at bottom surfaces of the plurality of recesses R1 and a sidewall of each of the first to third nanosheets N1, N2, and N3 in the nanosheet stack NSS.

In embodiments, to form the plurality of source/drain regions 130, one of a low-pressure chemical vapor deposition (LPCVD) process, a selective epitaxial growth (SEG) process, or a cyclic deposition and etching (CDE) process is performed by using source materials that include an element semiconductor precursor. The element semiconductor precursor includes a silicon (Si) source and/or a germanium (Ge) source.

In embodiments, to form the plurality of source/drain regions 130, at least one of silane ($SiH_4$), disilane ($Si_2H_6$), trisilane ($Si_3H_8$), and/or dichlorosilane ($SiH_2Cl_2$) is used as the Si source, without necessarily being limited thereto. At least one of germane ($GeH_4$), digermane ($Ge_2H_6$), trigermane ($Ge_3H_8$), tetragermane ($Ge_4H_{10}$), and/or dichlorogermane ($Ge_2H_2Cl_2$) is used as the Ge source, without necessarily being limited thereto. When the plurality of source/drain regions 130 include a SiGe layer doped with boron (B) atoms, at least one of diborane ($B_2H_6$), triborane, tetraborane, and/or pentaborane is used as a B source, without necessarily being limited thereto.

During the formation of the plurality of source/drain regions 130, substantially no epitaxial growth occurs on the surface of each of the second spacer portion 119 and a spacer corner portion SPC of the insulating spacer structure SPS that are adjacent to the recess R1. Accordingly, lateral growth of the source/drain region 130 in the second lateral direction (Y direction) is suppressed. Thus, the plurality of source/drain regions 130 that have the shape described above with reference to FIGS. 2A to 2E can be obtained.

In each of the plurality of source/drain regions 130, each of the sidewalls in the second lateral direction (Y direction) include a first crystal facet FS1, a facet-free sidewall portion NFS, and a second crystal facet FS2 that are sequentially arranged in a vertical direction (Z direction) away from the fin-type active region F1. In embodiments, in the vertical direction (Z direction), a height NH of the facet-free sidewall portion NFS is greater than each of a height FH1 of the first crystal facet FS1 and a height FH2 of the second crystal facet FS2. In embodiments, in the vertical direction (Z direction), the height NH of the facet-free sidewall portion NFS is greater than the sum of the height FH1 of the first crystal facet FS1 and the height FH2 of the second crystal facet FS2. In embodiments, in the vertical direction (Z direction), the height NH of the facet-free sidewall portion NFS is greater than ½ of the total height of the source/drain region 130.

In embodiments, an epitaxial growth process that forms the plurality of source/drain regions 130 is performed at a temperature in a range of about 560° C. to about 620° C., without necessarily being limited thereto.

Figure 8A:
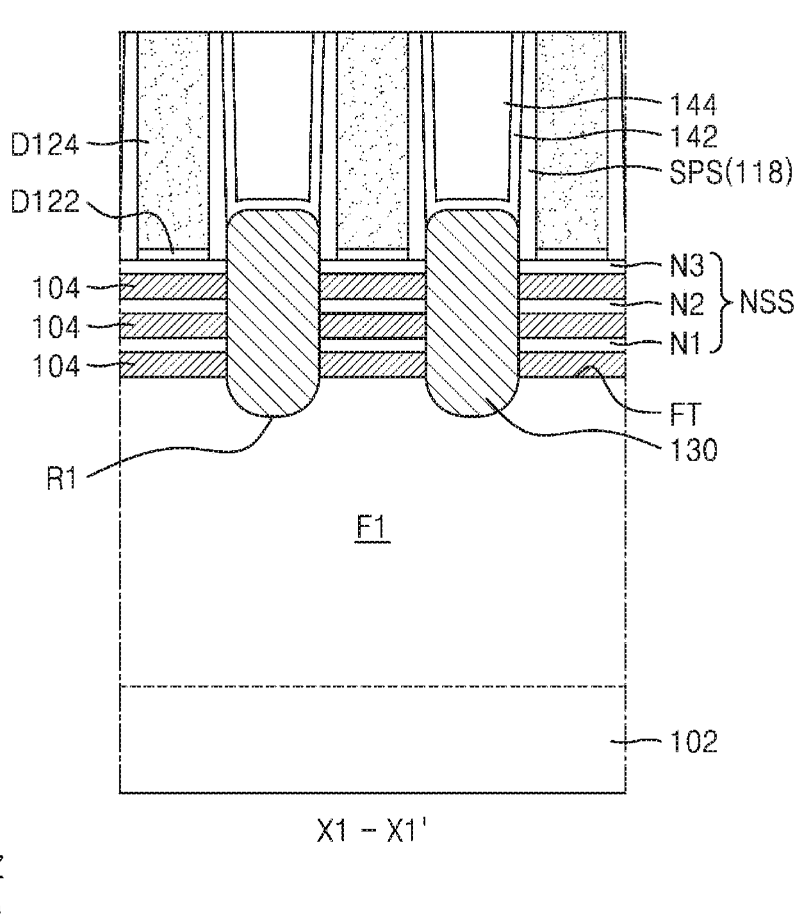
Figure 8B:
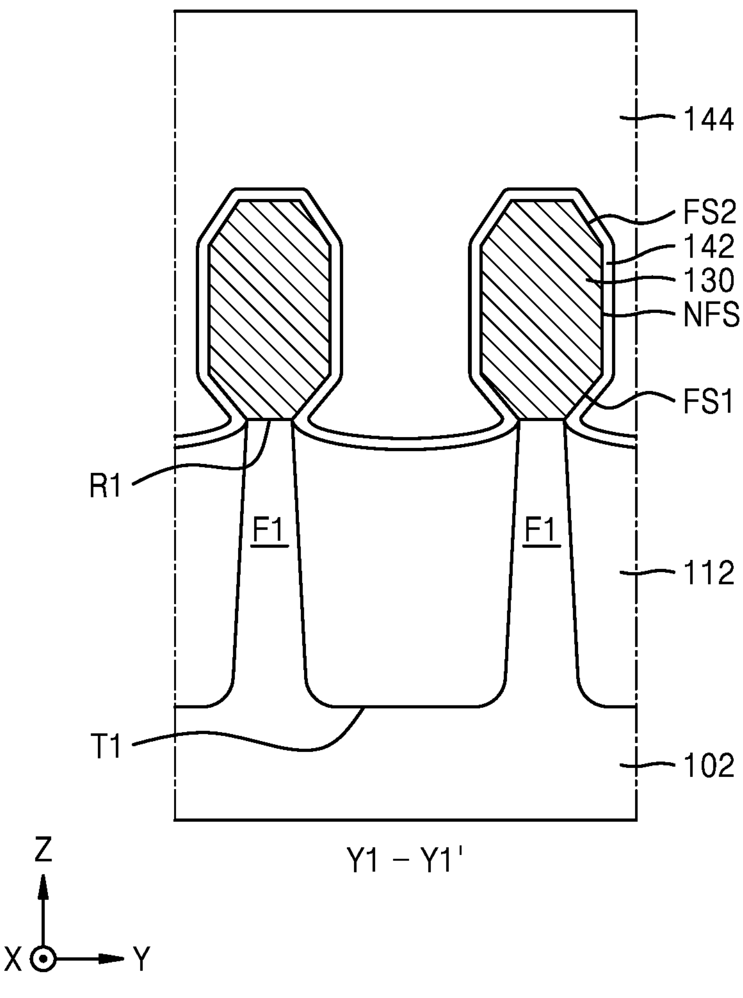
Figure 8C:
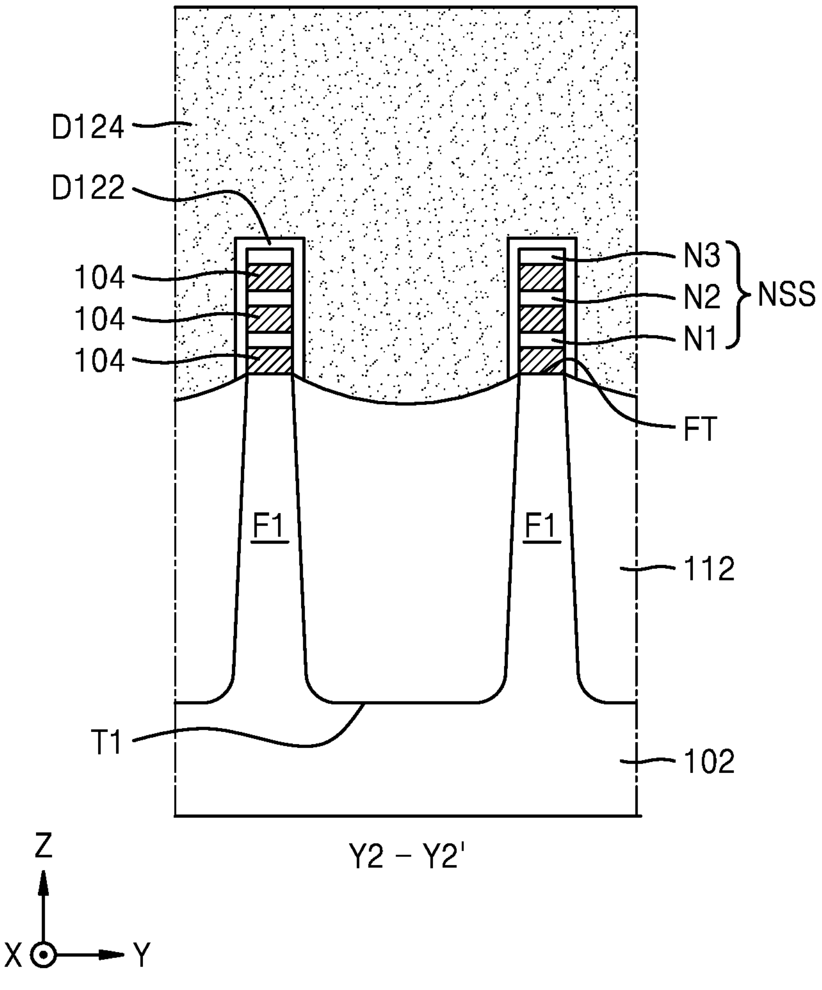

Referring to FIGS. 8A, 8B, and 8C, in an embodiment, an insulating liner 142 is formed that covers the resultant structure of FIGS. 7A and 7B, and an inter-gate dielectric film 144 is formed on the insulating liner 142. Thereafter, the insulating liner 142 and the inter-gate dielectric film 144 are planarized to expose a top surface of the capping layer D126. Thereafter, a top surface of the dummy gate layer D124 is exposed by removing the exposed capping layers D126, and the insulating liner 142 and the inter-gate dielectric film 144 are partially removed such that a top surface of the inter-gate dielectric film 144 and the top surface of the dummy gate layer D124 are substantially coplanar with each other.

Figure 9:
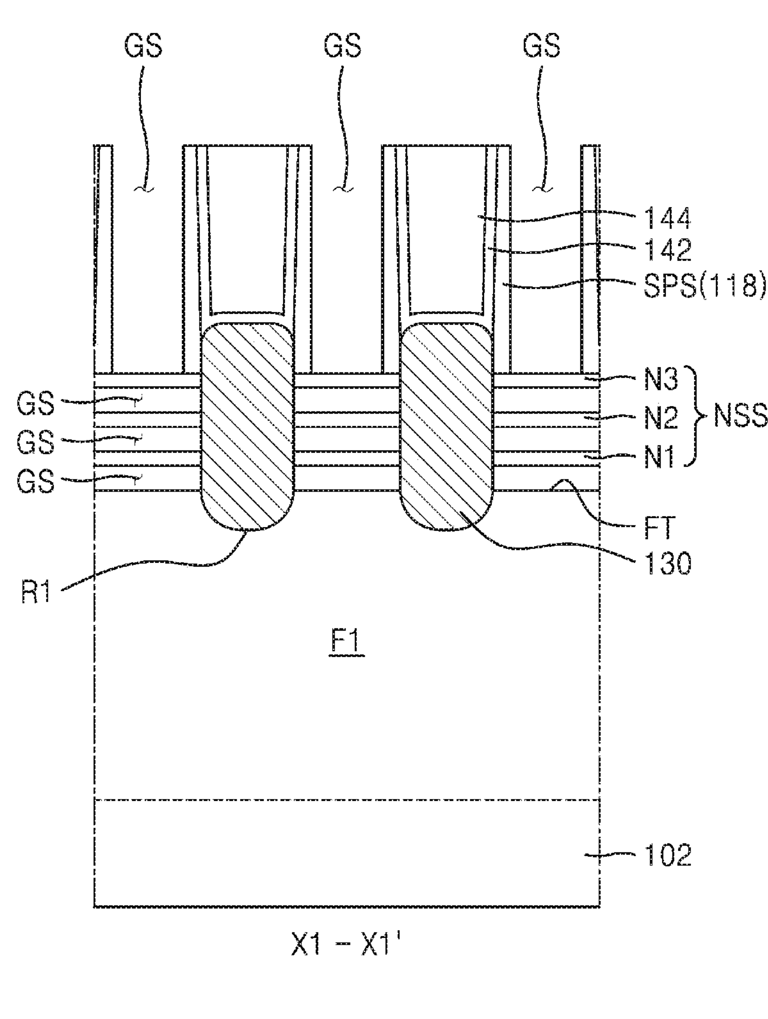
Figure 9:
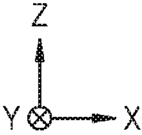

Referring to FIG. 9, in an embodiment, a gate space GS is prepared by removing the dummy gate layer D124 and the oxide film D122 located thereunder from the resultant structure of FIGS. 8A, 8B, and 8C, and the plurality of nanosheet stacks NSS are exposed through the gate space GS. The plurality of sacrificial semiconductor layers 104 that remain on the fin-type active region F1 are removed through the gate space GS, and thus, the gate space GS extends to respective spaces between the first to third nanosheets N1, N2, and N3 and a space between the first nanosheet N1 and the fin top surface FT of the fin-type active region F1. In embodiments, to selectively remove the plurality of sacrificial semiconductor layers 104, differences in etch selectivity between the first to third nanosheets N1, N2, and N3 and the plurality of sacrificial semiconductor layers 104 are used.

A liquid or gaseous etchant is used to selectively remove the plurality of sacrificial semiconductor layers 104. In embodiments, to selectively remove the plurality of sacrificial semiconductor layers 104, a $CH_3COOH$-based etchant, such as an etchant that includes a mixture of $CH_3COOH$, $HNO_3$, and HF, or an etchant that includes a mixture of $CH_3COOH$, $H_2O_2$, and HF, is used, without necessarily being limited thereto.

Figure 10:
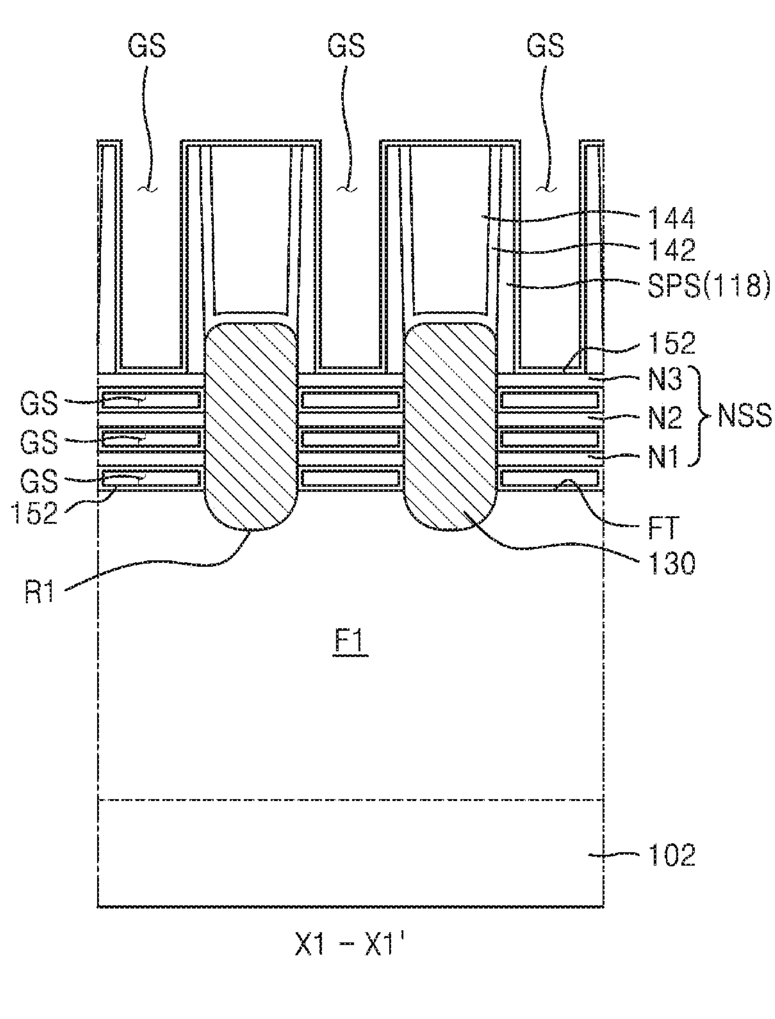
Figure 10:
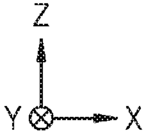

Referring to FIG. 10, in an embodiment, in the resultant structure of FIG. 9, a gate dielectric film 152 is formed that covers respective exposed surfaces of the first to third nanosheets N1, N2, and N3 and the fin-type active region F1. The gate dielectric film 152 is formed by using an atomic layer deposition (ALD) process.

Figure 11A:
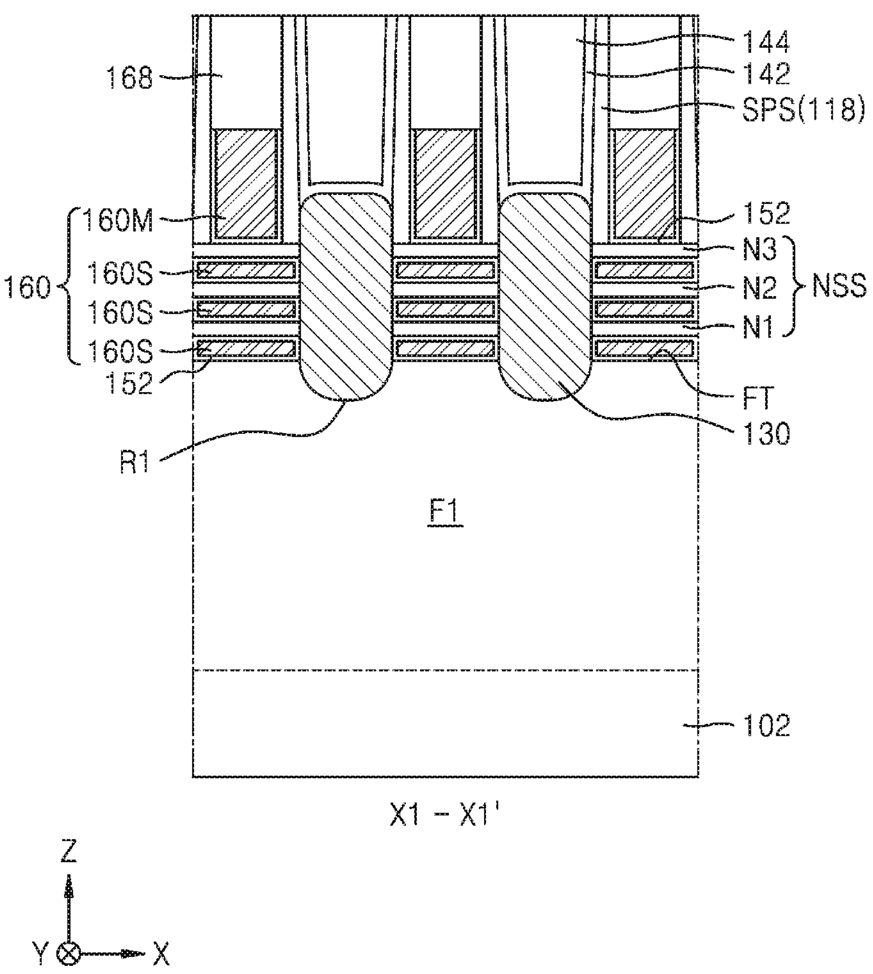
Figure 11B:
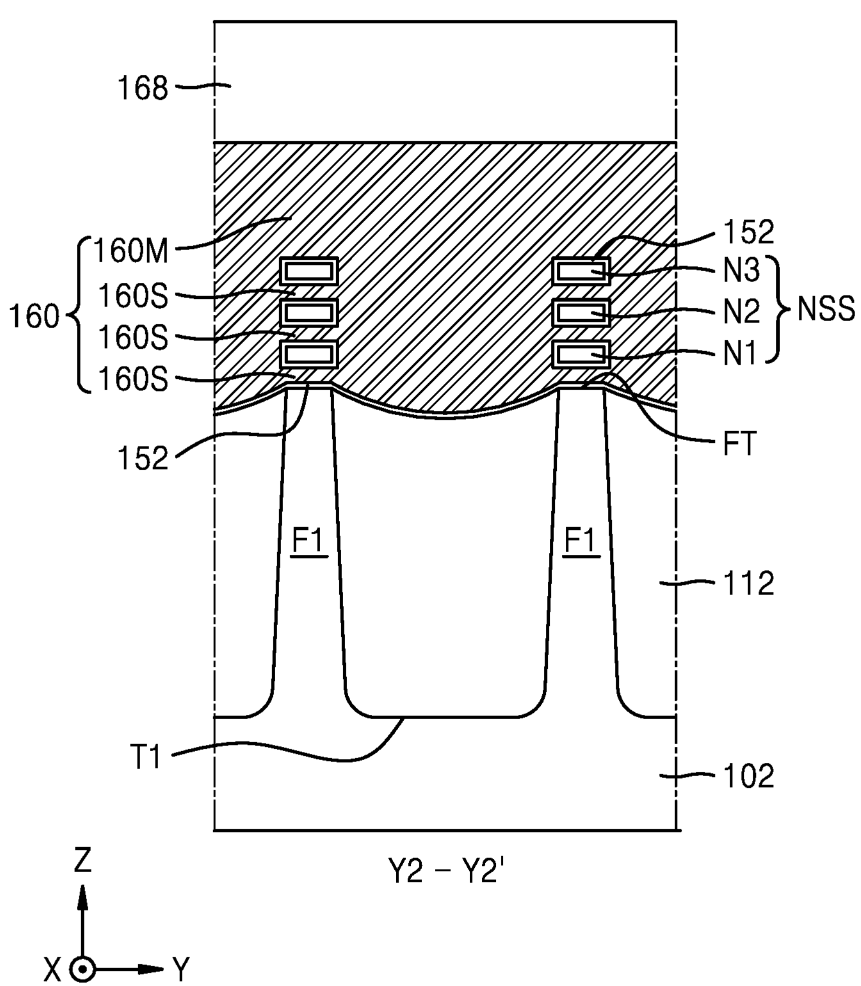

Referring to FIGS. 11A and 11B, in an embodiment, a gate line 160 and a capping insulating pattern 168 are formed. The gate line 160 fills the gate space GS (see FIG. 10) on the gate dielectric film 152. The capping insulating pattern 168 covers a top surface of each of the gate line 160 and the gate dielectric film 152 in the gate space GS.

Figure 12A:
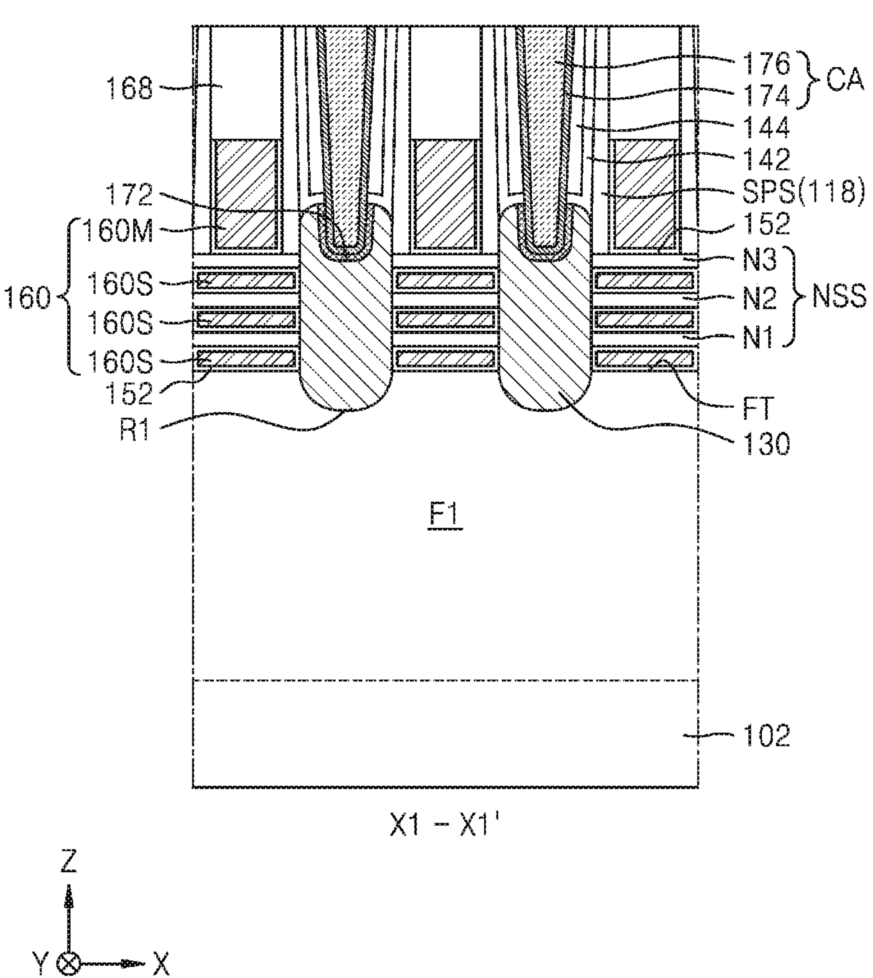
Figure 12B:
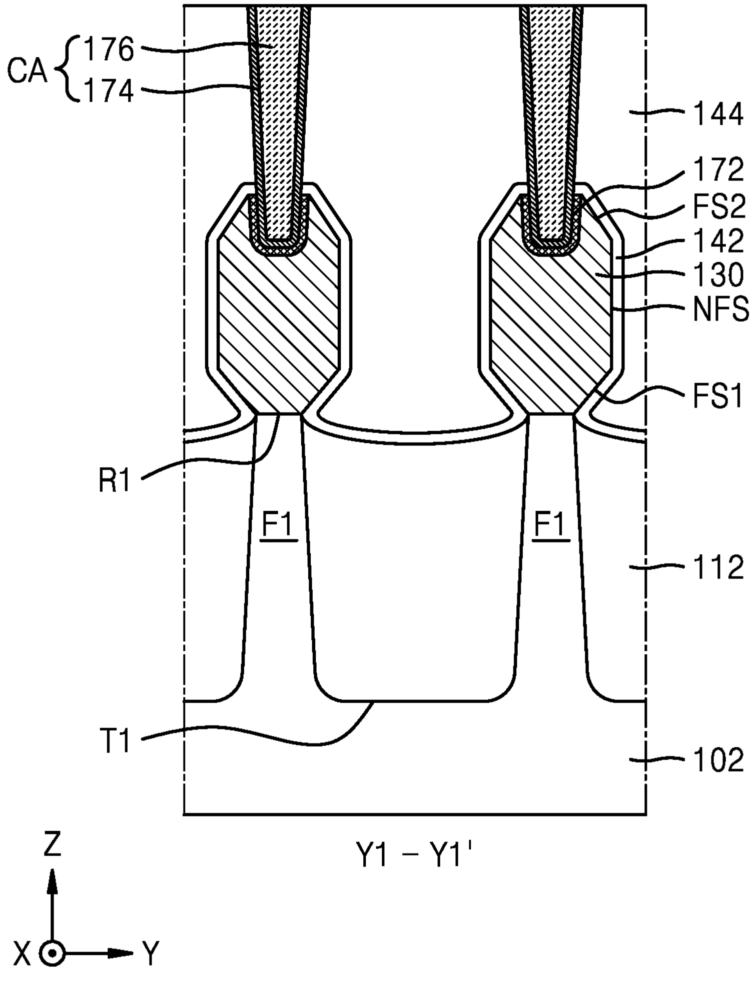

Referring to FIGS. 12A and 12B, in an embodiment, in the resultant structure of FIGS. 11A and 11B, a source/drain contact hole that exposes the source/drain region 130 is formed that passes through the insulating structure that includes the insulating liner 142 and the inter-gate dielectric film 144. Thereafter, a partial region of the source/drain region 130 is removed by using an anisotropic etching process through the source/drain contact hole, and thus, the source/drain contact hole extends further toward the substrate 102. A metal silicide film 172 is formed on the source/drain region 130 exposed at a bottom side of the source/drain contact hole. In embodiments, the formation of the metal silicide film 172 includes forming a metal liner that conformally covers the exposed surface of the source/drain region 130 and annealing the metal liner to induce a reaction of the source/drain region 130 with a metal in the metal liner. After the metal silicide film 172 is formed, the remaining portion of the metal liner is removed. A portion of the source/drain region 130 is consumed during the formation of the metal silicide film 172. In embodiments, when the metal silicide film 172 includes a titanium silicide film, the metal liner includes a titanium (Ti) film. Thereafter, a source/drain contact CA that includes a conductive barrier pattern 174 and a contact plug 176 is formed on the metal silicide film 172.

Figure 13A:
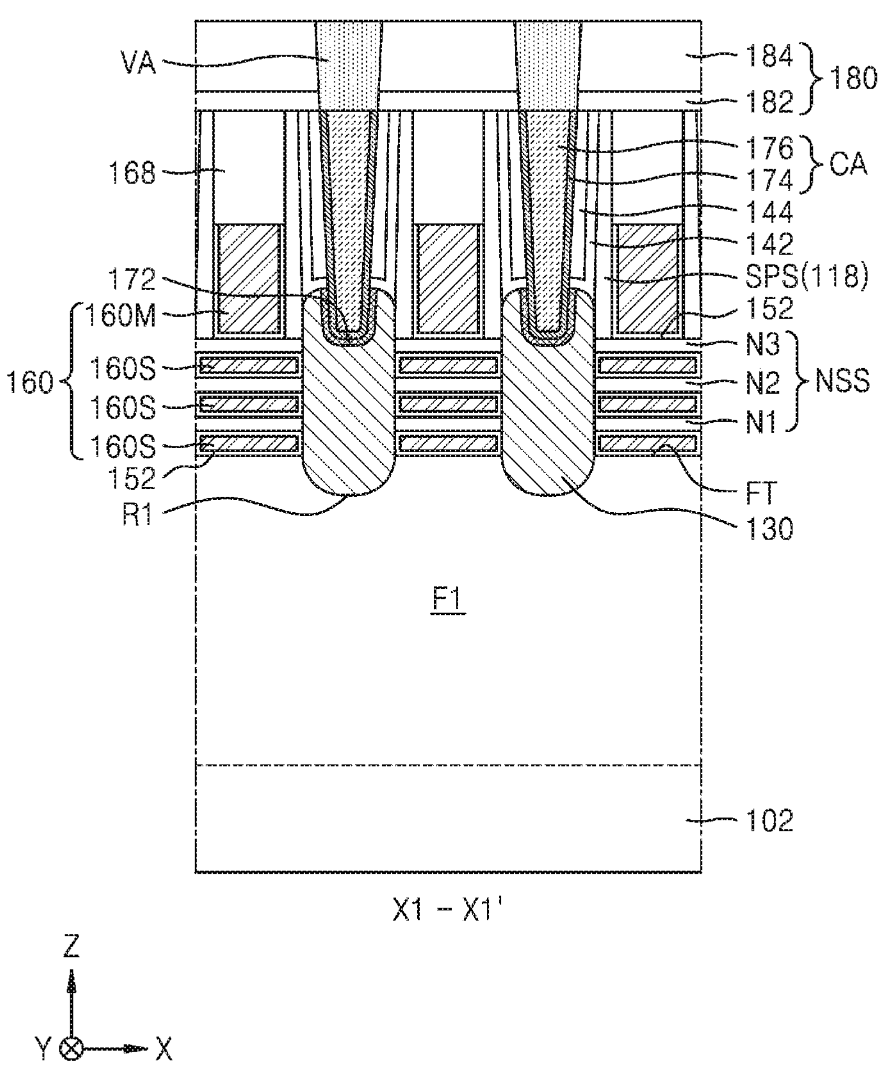
Figure 13B:
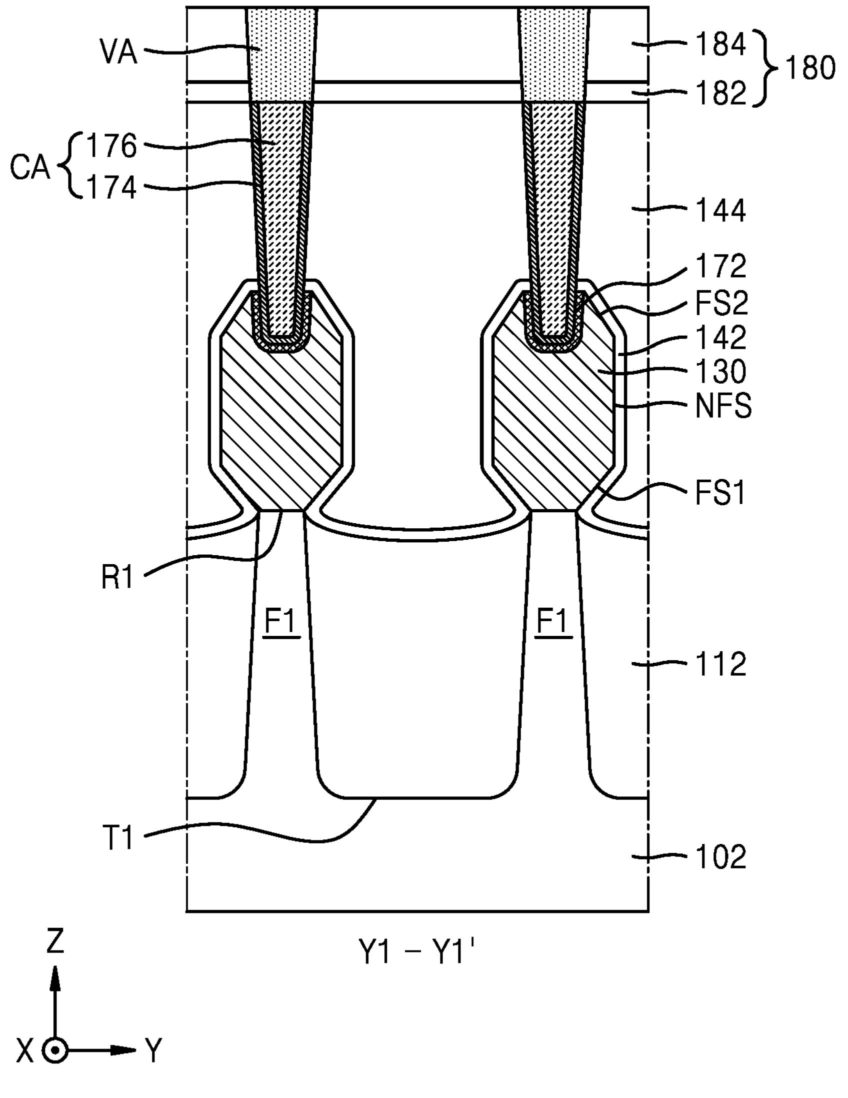
Figure 13C:
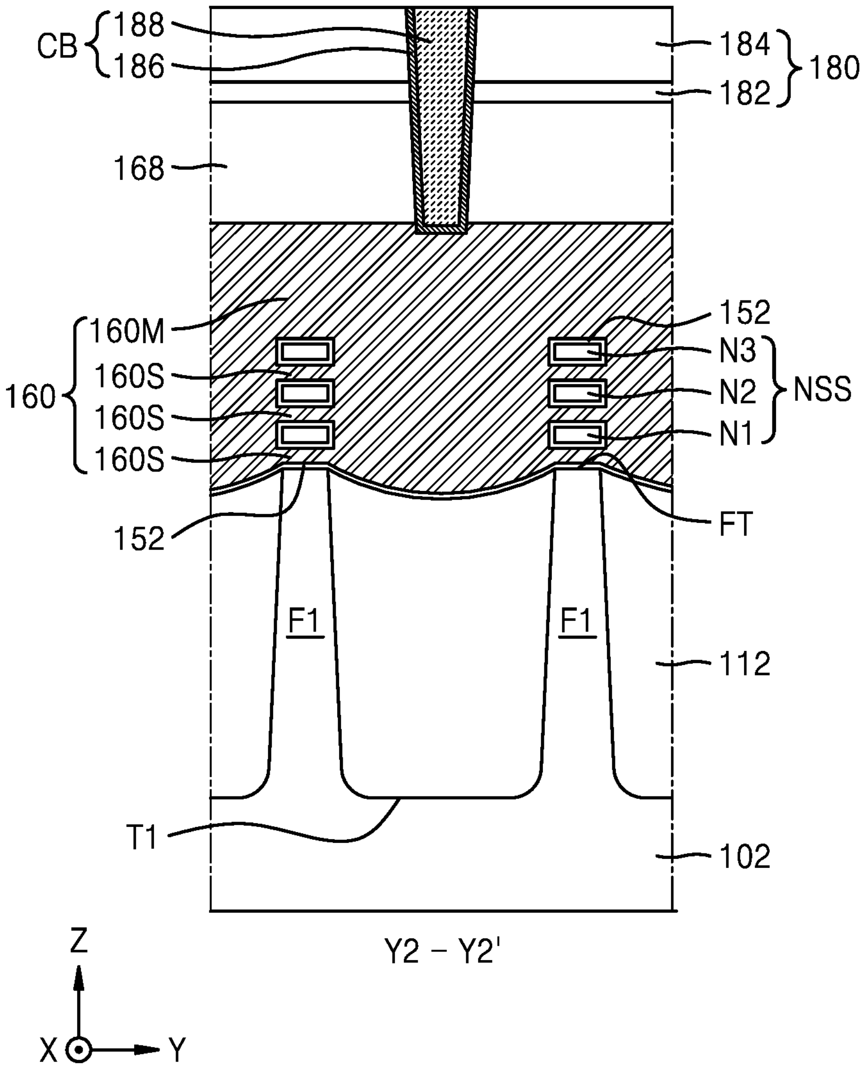

Referring to FIGS. 13A, 13B, and 13C, in an embodiment, an etch stop film 182 and an interlayer insulating film 184 are sequentially formed that cover the top surface of the inter-gate dielectric film 144, a top surface of each of a plurality of source/drain contacts CA, and a top surface of each of a plurality of capping insulating patterns 168, thereby forming an upper insulating structure 180. A plurality of source/drain via contacts VA are formed that pass through the upper insulating structure 180 in the vertical direction (Z direction) and are connected to the plurality of source/drain contacts CA. A gate contact CB is formed that passes through the upper insulating structure 180 and the capping insulating pattern 168 in the vertical direction (Z direction) and is connected to the gate line 160. The order of formation of the source/drain via contact VA and the gate contact CB is not specifically limited.

As illustrated in FIGS. 2A to 2C, in an embodiment, an upper insulating film 192 is formed that covers the upper insulating structure 180, and a plurality of upper wiring layers M1 are formed that pass through the upper insulating film 192 and are connected to the source/drain via contact VA and the gate contact CB.

Figure 14:
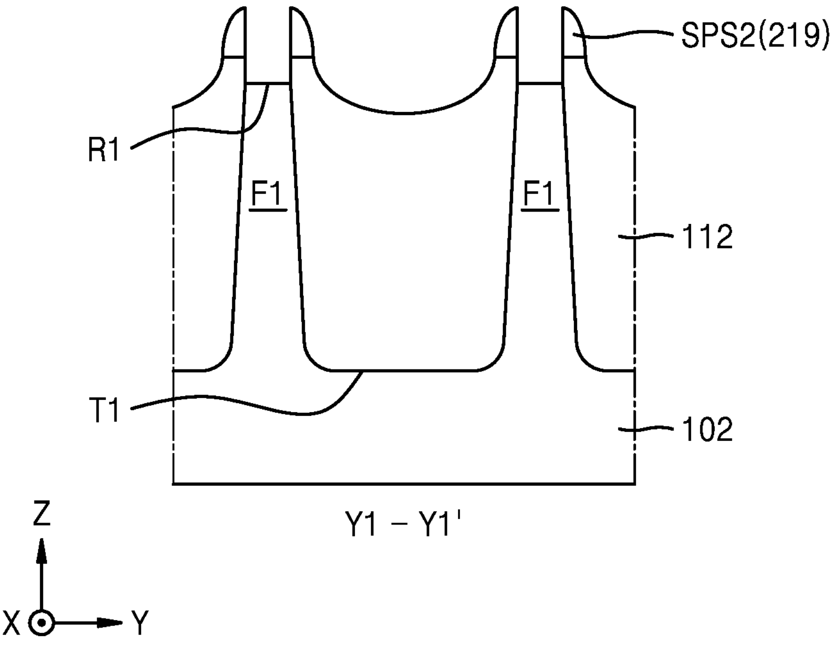
FIGS. 14 and 15 are cross-sectional views that illustrate a process sequence of a method of manufacturing an IC device, according to embodiments.
Figure 15:
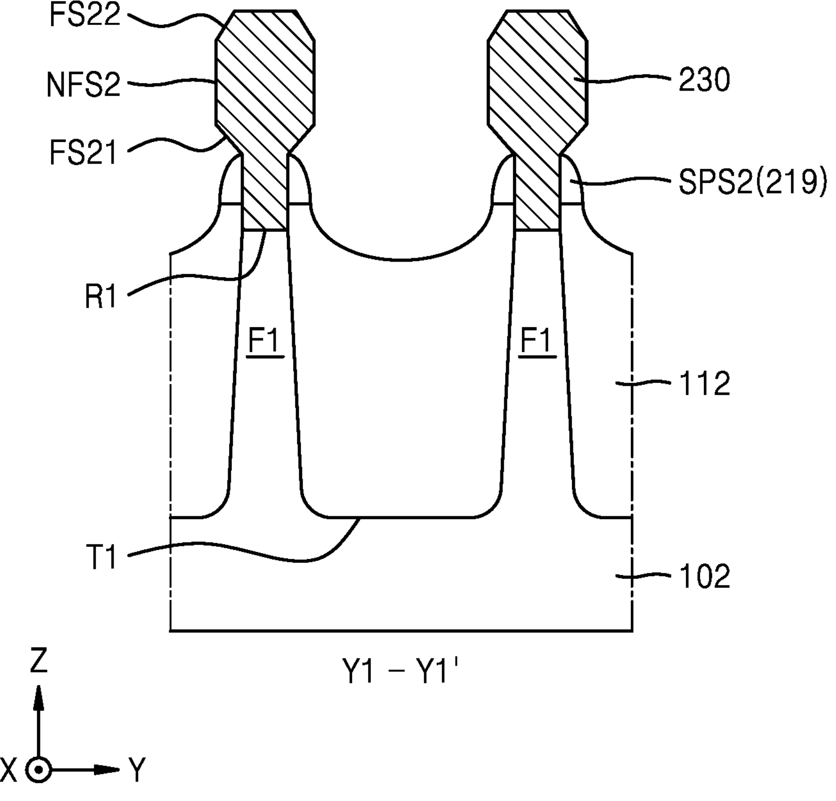

FIGS. 14 and 15 are cross-sectional views that illustrate a process sequence of a method of manufacturing an IC device, according to embodiments. Cross-sectional structures taken along line Y1-Y1' of FIG. 1 are illustrated in FIGS. 14 and 15. A method of manufacturing the IC device 200 shown in FIGS. 3A and 3B is described with reference to FIGS. 14 and 15. In FIGS. 14 and 15, the same reference numerals are used to denote the same elements as in FIGS. 1 to 3B, and repeated descriptions thereof are omitted here.

Referring to FIG. 14, in an embodiment, processes similar to those described with reference to FIGS. 5 to 6C may be performed. However, by controlling the anisotropic dry etching conditions of the spacer insulating film in an embodiment of FIG. 14, an insulating spacer structure SPS2 that includes a first spacer portion 118, a second spacer portion 219, and a spacer corner portion SPC is formed instead of the insulating spacer structure SPS.

Referring to FIG. 15, in an embodiment, a process described with reference to FIGS. 7A and 7B is performed on the resultant structure of FIG. 14, and thus, a plurality of source/drain regions 230 are formed that fill the plurality of recesses R1.

Processes similar to those described with reference to FIGS. 8A to 13C are performed, and thus, the IC device 200 shown in FIGS. 3A and 3B can be manufactured.

Although methods of manufacturing the IC devices 100 and 200 shown in FIGS. 1 to 3B have been described with reference to FIGS. 5 to 15, it will be understood that the IC devices 100 and 200 and IC devices having various other structures can be manufactured by applying various modifications and changes to processes described with reference to FIGS. 5 to 15 within the scope of embodiments of the inventive concept.

While embodiments of the inventive concept has been particularly shown and described with reference to the accompanying drawings, it will be understood that various changes in form and details may be made therein without departing from the spirit and scope of the following claims.

What is claimed is:

1. An integrated circuit device, comprising:

a fin-type active region that extends along a first lateral direction on a substrate;

a pair of gate lines that extend along a second lateral direction on the fin-type active region, wherein the second lateral direction intersects the first lateral direction;

a source/drain region disposed on the fin-type active region and interposed between the pair of gate lines; and a pair of insulating spacer structures that cover the pair of gate lines and the source/drain region, wherein each insulating spacer structure of the pair of insulating spacer structures comprises:

a first spacer portion that covers a sidewall of one gate line of the pair of gate lines, wherein the first spacer portion extends along the second lateral direction;

a second spacer portion integrally connected to the first spacer portion, wherein the second spacer portion protrudes in the first lateral direction and covers a partial region of a sidewall of the source/drain region; and a spacer corner portion that fills corner spaces defined by the one gate line and the source/drain region between the first spacer portion and the second spacer portion, wherein each insulating spacer structure of the pair of insulating spacer structures has a single film structure that includes a silicon oxycarbide (SiOC) film doped with about 0 at % to about 5 at % of nitrogen atoms, and wherein, in each insulating spacer structure of the pair of insulating spacer structures, the second spacer portion has a planar shape of which a width in the second lateral direction that gradually decreases with increasing distance in the first lateral direction from the one gate line.

2. The integrated circuit device of claim 1, wherein the source/drain region includes a first portion that has a greatest width in the second lateral direction, and the first portion comprises facet-free sidewall portions on both sides in the second lateral direction, wherein each facet-free sidewall portion extends in a vertical direction, and the first portion of the source/drain region does not overlap the insulating spacer structure in the vertical direction.

3. The integrated circuit device of claim 1, wherein each of a thickness of the spacer corner portion in the first lateral direction and a thickness of the spacer corner portion in the second lateral direction is greater than a thickness of the first spacer portion in the first lateral direction.

4. The integrated circuit device of claim 1, wherein the second spacer portions included in the pair of insulating spacer structures are integrally connected to each other.

5. The integrated circuit device of claim 1, wherein each of the sidewalls of the source/drain region in the second lateral direction includes at least one crystal facet and a facet-free sidewall portion, and a height of the facet-free sidewall portion in a vertical direction is greater than a height of the at least one crystal facet in a vertical direction.

6. The integrated circuit device of claim 1, wherein each of the sidewalls of the source/drain region in the second lateral direction includes a first crystal facet that includes a surface inclined in a direction toward the substrate, a second crystal facet that includes a surface inclined in a direction away from the substrate, and a facet-free sidewall portion that extends in a vertical direction, and the first crystal facet and the second crystal facet are spaced apart from each other in the vertical direction with the facet-free sidewall portion interposed therebetween.

7. The integrated circuit device of claim 1, wherein each insulating spacer structure of the pair of insulating spacer structures includes a SiOC film that does not include nitrogen atoms.

8. The integrated circuit device of claim 1, wherein the pair of insulating spacer structures includes about 2 at % to about 40 at % of carbon atoms, about 30 at % to about 60 at % of silicon atoms, and about 40 at % to about 70 at % of oxygen atoms.

9. The integrated circuit device of claim 1, further comprising a device isolation film that covers both sidewalls of the fin-type active region, wherein a lowermost surface of the source/drain region is coplanar with an uppermost surface of the device isolation film.

10. The integrated circuit device of claim 1, further comprising:

a device isolation film that covers both sidewalls of the fin-type active region; and an insulating liner that covers the source/drain region and the device isolation film, wherein the fin-type active region includes a recess that has a lowermost surface at a vertical level lower than a vertical level of a fin top surface of the fin-type active region, the source/drain region includes a crystal facet that includes a surface inclined toward the substrate from the lowermost surface of the recess, and the insulating liner is in contact with the fin-type active region, the source/drain region, and an interface between the fin-type active region and the source/drain region in a region adjacent to the lowermost surface of the recess.

11. An integrated circuit device, comprising:

a fin-type active region that extends along a first lateral direction on a substrate;

at least one nanosheet that is spaced apart from a fin top surface of the fin-type active region in a vertical direction, wherein the at least one nanosheet faces the fin top surface of the fin-type active region;

a gate line that surrounds the at least one nanosheet on the fin-type active region, wherein the gate line extends along a second lateral direction, wherein the second lateral direction intersects the first lateral direction;

a source/drain region disposed on the fin-type active region adjacent to the gate line, wherein the source/drain region is in contact with the at least one nanosheet;

an insulating spacer structure that covers a sidewall of the gate line and a portion of the source/drain region; and a device isolation film that covers both sidewalls of the fin-type active region, wherein the insulating spacer structure comprises:

a first spacer portion that covers the sidewall of the gate line and extends along the second lateral direction;

a second spacer portion integrally connected to the first spacer portion, wherein the second spacer portion protrudes in the first lateral direction and covers a partial region of a sidewall of the source/drain region; and a spacer corner portion that fills a corner space defined by the gate line and the source/drain region between the first spacer portion and the second spacer portion, wherein the insulating spacer structure has a single film structure that includes a silicon oxycarbide (SiOC) film doped with about 0 at % to about 5 at % of nitrogen atoms, and wherein the second spacer portion has a planar shape of which a width in the second lateral direction gradually decreases with increasing distance from the first spacer portion.

12. The integrated circuit device of claim 11, wherein the source/drain region includes a first portion that has a greatest width in the second lateral direction, wherein the first portion includes a facet-free sidewall portion that extends in the vertical direction, and a length of the facet-free sidewall portion in the vertical direction is greater than ½ of the total length of the source/drain region in the vertical direction.

13. The integrated circuit device of claim 11, wherein the source/drain region includes a first portion that has a greatest width in the second lateral direction, and the first portion includes facet-free sidewall portions on both sides in the second lateral direction, wherein each facet-free sidewall portion extends in the vertical direction, and the first portion of the source/drain region does not overlap the second spacer portion of the insulating spacer structure in the vertical direction.

14. The integrated circuit device of claim 11, wherein each of a thickness of the spacer corner portion in the first lateral direction and a thickness of the spacer corner portion in the second lateral direction is greater than a thickness of the first spacer portion in the first lateral direction.

15. The integrated circuit device of claim 11, wherein the source/drain region includes a first portion that has a greatest width in the second lateral direction, and the first portion includes facet-free sidewall portions on both sides in the second lateral direction, wherein each facet-free sidewall portion extends in the vertical direction, and the first portion of the source/drain region overlaps the second spacer portion of the insulating spacer structure in the vertical direction.

16. The integrated circuit device of claim 11, wherein each of the sidewalls of the source/drain region in the second lateral direction includes a first crystal facet, a facet-free sidewall portion, and a second crystal facet that are sequentially arranged in a direction away from the fin-type active region, the first crystal facet includes a surface inclined in a direction toward the substrate, the facet-free sidewall portion includes a surface that extends in a vertical direction, and the second crystal facet includes a surface inclined in a direction away from the substrate.

17. The integrated circuit device of claim 11, wherein the insulating spacer structure includes a SiOC film that does not include nitrogen atoms, wherein the SiOC film includes about 2 at % to about 40 at % of carbon atoms, about 30 at % to about 60 at % of silicon atoms, and about 40 at % to about 70 at % of oxygen atoms.

18. An integrated circuit device, comprising:

a fin-type active region;

a source/drain region disposed on the fin-type active region;

a pair of nanosheet stacks that are spaced apart from each other in a first lateral direction with the source/drain region interposed therebetween, wherein each nanosheet stack includes at least one nanosheet that is spaced apart in a vertical direction from a fin top surface of the fin-type active region, and each nanosheet stack faces the fin top surface of the fin-type active region and contacts the source/drain region;

a pair of gate lines that each surround the at least one nanosheet of a respective nanosheet stack on the fin-type active region, wherein the pair of gate lines extend along a second lateral direction, wherein the second lateral direction intersects the first lateral direction; and a plurality of insulating spacer structures that cover the pair of gate lines and the source/drain region, wherein the plurality of insulating spacer structures include a plurality of first spacer portions, a plurality of second spacer portions, and a plurality of spacer corner portions, wherein the plurality of first spacer portions respectively cover sidewalls of the pair of gate lines, the plurality of second spacer portions are integrally connected to the plurality of first spacer portions and cover a portion of the source/drain region, and the plurality of spacer corner portions are interposed between the plurality of first spacer portions and the plurality of second spacer portions and fill corner spaces defined by the pair of gate lines and the source/drain region, wherein a thickness of each of the plurality of spacer corner portions in the first lateral direction and a thickness of each of the plurality of spacer corner portions in the second lateral direction are each greater than a thickness of each of the plurality of first spacer portions in the first lateral direction, and wherein each insulating spacer structure of the plurality of insulating spacer structures has a single film structure that includes a silicon oxycarbide (SiOC) film doped with about 0 at % to about 5 at % of nitrogen atoms.

* * * * *